(12) United States Patent
Subramanian et al.

(10) Patent No.: US 6,711,052 B2
(45) Date of Patent: Mar. 23, 2004

(54) MEMORY HAVING A PRECHARGE CIRCUIT AND METHOD THEREFOR

(75) Inventors: Chitra K. Subramanian, Austin, TX (US); Thomas W. Andre, Austin, TX (US); Joseph J. Nahas, Austin, TX (US)

(73) Assignee: Motorola, Inc., Schaumberg, IL (US)

( * ) Notice: Subject to any disclaimer, the term of this patent is extended or adjusted under 35 U.S.C. 154(b) by 0 days.

(21) Appl. No.: 10/185,488

(22) Filed: Jun. 28, 2002

(65) Prior Publication Data

US 2004/0001351 A1 Jan. 1, 2004

(51) Int. Cl.[7] .................................................. G11C 7/00
(52) U.S. Cl. .................................. 365/158; 365/230.03
(58) Field of Search ............................. 365/158, 230.03

(56) References Cited

U.S. PATENT DOCUMENTS

| | | | |
|---|---|---|---|
| 3,832,699 A | * 8/1974 | Matsue ........................ 340/173 |
| 4,713,797 A | 12/1987 | Morton et al. ............... 365/208 |
| 6,236,611 B1 | 5/2001 | Naji ............................ 365/226 |
| 6,256,224 B1 | 7/2001 | Perner et al. ................ 365/173 |

* cited by examiner

Primary Examiner—M. Tran
(74) Attorney, Agent, or Firm—Robert L. King; Daniel D. Hill

(57) ABSTRACT

A magnetoresistive random access memory (MRAM) has separate read and write paths. Switchable current mirrors, each having multiple series-connected stages, receive a common reference current. A timing circuit provides control signals to word and bit decoders and to the switchable current mirrors to selectively complete current paths through a predetermined write word line and a predetermined write bit line. Bit lines are connected together at a common end, and word lines are connected together at a common end. By precharging a common rail having multiple write bit lines connected together, the write noise immunity is improved and current spikes are minimized. Groups of bit lines may be connected via a metal option to adjust a transition time of a programming current.

17 Claims, 13 Drawing Sheets

MEMORY HAVING A PRECHARGE CIRCUIT AND METHOD THEREFOR

RELATED APPLICATIONS

This application is related to:

U.S. patent application Ser. No. 09/978,859, now U.S. Pat. No. 6,545,906, entitled "A Method of Writing to a Scalable Magnetoresistance Random Access Memory Element," filed Oct. 16, 2001, and assigned to the assignee hereof;

U.S. patent application Ser. No. 10/186,141, entitled "Circuit and Method of Writing a Toggle Memory," filed simultaneously herewith, and assigned to the assignee hereof;

U.S. patent application Ser. No. 10/185,868, entitled "MRAM Architecture With Electrically Isolated Read and Write Circuitry," filed simultaneously herewith, and assigned to the assignee hereof;

U.S. patent application Ser. No. 10/185,075, entitled "Memory Having Write Current Ramp Rate Control," filed simultaneously herewith, and assigned to the assignee hereof; and U.S. patent application Ser. No. 10/185,888, entitled "Memory Architecture With Write Circuitry and Method Therefor," filed simultaneously herewith, and assigned to the assignee hereof.

FIELD OF THE INVENTION

This invention relates to Magnetoresistive Random Access Memories (MRAMs), and more particularly to architectures for MRAMs.

BACKGROUND OF THE INVENTION

Non-volatile memory devices, such as FLASH memories, are extremely important components in electronic systems. FLASH is a major non-volatile memory device in use today. Disadvantages of FLASH memory include high voltage requirements and slow program and erase times. Also, FLASH memory has a poor write endurance of $10^4$–$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, magnetic memory devices are being evaluated. One such device is magnetoresistive RAM (hereinafter referred to as "MRAM"). To be commercially practical, however, MRAM must have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three of the most important aspects of its design characteristics. A memory state in MRAM is not maintained by power, but rather by the direction of the magnetic moment vector. Storing data is accomplished by applying magnetic fields and causing a magnetic material in a MRAM device to be magnetized into either of two possible memory states. Recalling data is accomplished by sensing the resistive differences in the MRAM device between the two states. The magnetic fields for writing are created by passing currents through strip lines external to the magnetic structure or through the magnetic structures themselves.

As the lateral dimension of an MRAM device decreases, three problems occur. First, the switching field increases for a given shape and film thickness, requiring a larger magnetic field to switch. Second, the total switching volume is reduced so that the energy barrier for reversal decreases. The energy barrier refers to the amount of energy needed to switch the magnetic moment vector from one state to the other. The energy barrier determines the data retention and error rate of the MRAM device and unintended reversals can occur due to thermofluctuations (superparamagnetism) if the barrier is too small. A major problem with having a small energy barrier is that it becomes extremely difficult to selectively switch one MRAM device in an array. Selectability allows switching without inadvertently switching other MRAM devices. It is important to control the current flowing during a write operation in the array to avoid undesired current surges or spikes during transistor switching.

Finally, because the switching field is produced by shape, the switching field becomes more sensitive to shape variations as the MRAM device decreases in size. With photolithography scaling becoming more difficult at smaller dimensions, MRAM devices will have difficulty maintaining tight switching distributions. In any memory type, including MRAMs, there is a continuing desire to reduce the memory size and increase performance. One important aspect of performance is the speed with which the memory is read and programmed (written). Speed limitations include such things as the performance of the bit cell and the capacitance of the lines running through the array. A variety of techniques have been developed to improve these characteristics. For example, memory arrays have commonly been divided into subarrays so that no single line is excessively capacitive. This can also reduce power consumption. It is important in memories to efficiently switch the write circuitry to allow the write cycle speed to approximate the read cycle speed. The inability of a FLASH to accomplish this objective is a major disadvantage of FLASH.

The promise of MRAMs is, however, that of a universal memory that can be high speed and non-volatile. Thus, the need for improvements in speed and memory area efficiency continue. Thus, there is need for further improvements in architecture for MRAMs.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 4 is a graph illustrating the timing diagram of the word current and the bit current when both are turned on;

FIG. 9 is a graph illustrating the timing diagram of the word current and the bit current when only the bit current is turned on;

FIG. 10 is a graph illustrating the rotation of the magnetic moment vectors for a magnetoresistive random access memory device when only the bit current is turned on;

DETAILED DESCRIPTION OF THE PREFERRED EMBODIMENT

A memory architecture uses separate word lines for the read and write operations as well as separate bit lines for the read and write operations and is grouped into groups of bits with common local read bit lines. The groups are further folded so that two groups that are selectively coupled to the same global bit line share the same word lines. These characteristics provide the benefits of smaller write driver area, smaller average bit size for the memory core, allowing overlap between read and write operations, reduced global bit line capacitance, and higher voltage writing.

Figure 1:
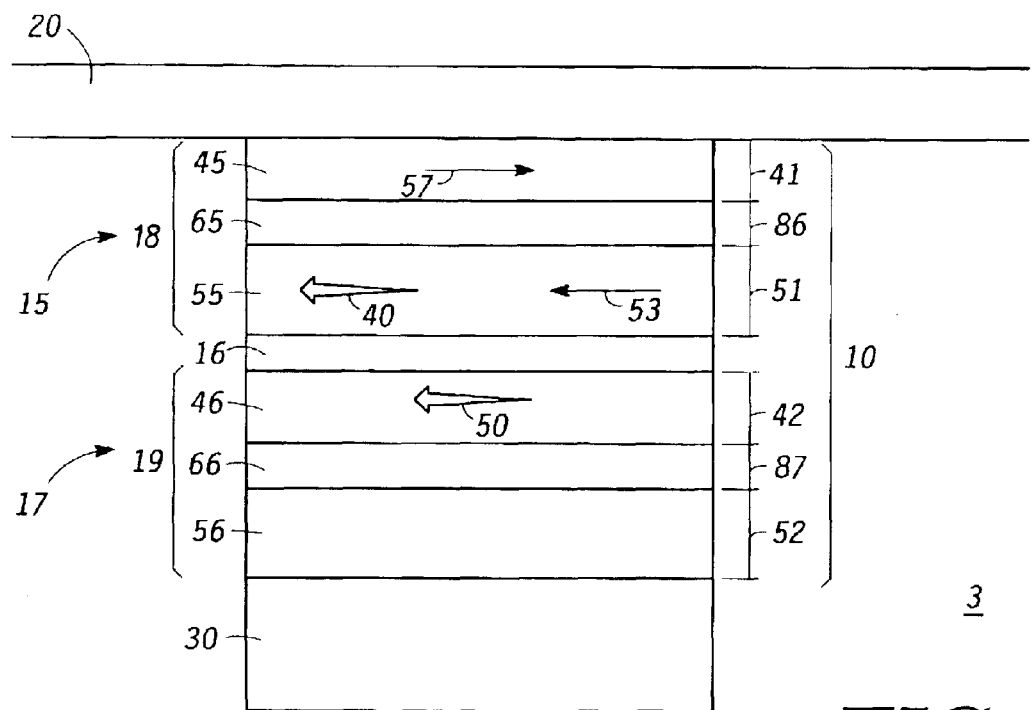
FIG. 1 is a simplified sectional view of a magnetoresistive random access memory device.

Turn now to FIG. 1, which illustrates a simplified sectional view of an MRAM array 3 in accordance with the preferred embodiment of the present invention. In this illustration, only a single magnetoresistive memory device 10 is shown, but it will be understood that MRAM array 3 consists of a number of MRAM devices 10 and we are showing only one such device for simplicity in describing the writing method.

MRAM device 10 includes a write word line 20 and a write bit line 30. Write word line 20 and write bit line 30 include conductive material such that a current can be passed therethrough. In this illustration, write word line 20 is positioned on top of MRAM device 10 and write bit line 30 is positioned on the bottom of MRAM device 10 and is directed at a 90° angle to word line 20 (See FIG. 2). As an alternative, write word line 20 may be positioned on the bottom of MRAM device 10 and write bit line 30 may be positioned on top of MRAM device 10

MRAM device 10 includes tunnel junction comprising a first magnetic region 15, a tunneling barrier 16, and a second magnetic region 17, wherein tunneling barrier 16 is sandwiched therebetween first magnetic region 15 and second magnetic region 17. In the preferred embodiment, magnetic region 15 includes a tri-layer structure 18, which has an anti-ferromagnetic coupling spacer layer 65 between two ferromagnetic layers 45 and 55. Anti-ferromagnetic coupling spacer layer 65 has a thickness 86 and ferromagnetic layers 45 and 55 have thicknesses 41 and 51, respectively. Further, magnetic region 17 has a tri-layer structure 19, which has an anti-ferromagnetic coupling spacer layer 66 between two ferromagnetic layers 46 and 56. Anti-ferromagnetic coupling spacer layer 66 has a thickness 87 and ferromagnetic layers 46 and 56 have thicknesses 42 and 52, respectively.

Generally, anti-ferromagnetic coupling spacer layers 65 and 66 include at least one of the elements Ru, Os, Re, Cr, Rh, Cu, or combinations thereof. Further, ferromagnetic layers 45, 55, 46, and 56 include at least one of elements Ni, Fe, Mn, Co, or combinations thereof. Also, it will be understood that magnetic regions 15 and 17 can include synthetic anti-ferromagnetic (SAF) layer material structures other than tri-layer structures and the use of tri-layer structures in this embodiment is for illustrative purposes only. For example, one such synthetic anti-ferromagnetic layer material structure could include a five-layer stack of a ferromagnetic layer/anti-ferromagnetic coupling spacer layer/ferromagnetic layer/anti-ferromagnetic coupling spacer layer/ferromagnetic layer structure.

Ferromagnetic layers 45 and 55 each have a magnetic moment vector 57 and 53, respectively, that are usually held anti-parallel by coupling of the anti-ferromagnetic coupling spacer layer 65. Also, magnetic region 15 has a resultant magnetic moment vector 40 and magnetic region 17 has a resultant magnetic moment vector 50. Resultant magnetic moment vectors 40 and 50 are oriented along an anisotropy easy-axis in a direction that is at an angle, preferably 45°, from write word line 20 and write bit line 30 (See FIG. 2). Further, magnetic region 15 is a free ferromagnetic region, meaning that resultant magnetic moment vector 40 is free to rotate in the presence of an applied magnetic field. Magnetic region 17 is a pinned ferromagnetic region, meaning that resultant magnetic moment vector 50 is not free to rotate in the presence of a moderate applied magnetic field and is used as the reference layer.

While anti-ferromagnetic coupling layers are illustrated between the two ferromagnetic layers in each tri-layer structure 18, it will be understood that the ferromagnetic layers could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

In the preferred embodiment, MRAM device 10 has tri-layer structures that have a length/width ratio in a range of 1 to 5 for a non-circular plan. However, we illustrate a plan that is circular (See FIG. 2). MRAM device 10 is circular in shape in the preferred embodiment to minimize the contribution to the switching field from shape anisotropy and also because it is easier to use photolithographic processing to scale the device to smaller dimensions laterally. However, it will be understood that MRAM device 10 can have other shapes, such as square, elliptical, rectangular, or diamond, but is illustrated as being circular for simplicity.

Further, during fabrication of MRAM array 3, each succeeding layer (i.e. 30, 55, 65, etc.) is deposited or otherwise formed in sequence and each MRAM device 10 may be defined by selective deposition, photolithography processing, etching, etc. in any of the techniques known in the semiconductor industry. During deposition of at least the ferromagnetic layers 45 and 55, a magnetic field is provided to set a preferred easy magnetic axis for this pair (induced anisotropy). The provided magnetic field creates a preferred anisotropy axis for magnetic moment vectors 53 and 57. The preferred axis is chosen to be at a 45° angle between write word line 20 and write bit line 30, as will be discussed presently.

Figure 2:
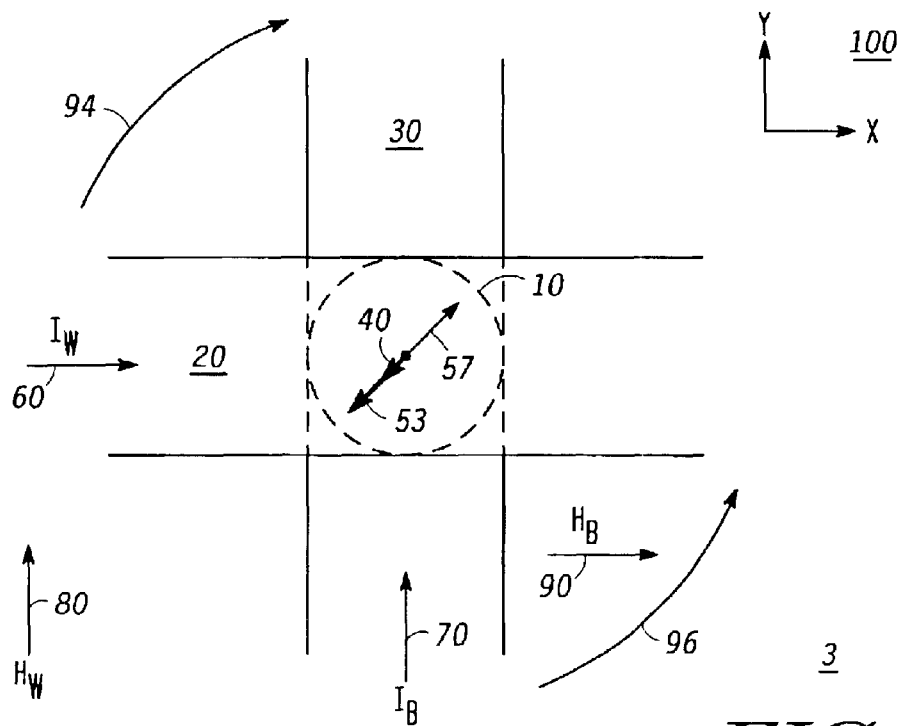
FIG. 2 is a simplified plan view of a magnetoresistive random access memory device with word and bit lines.

Turn now to FIG. 2, which illustrates a simplified plan view of a MRAM array 3 in accordance with the present invention. To simplify the description of MRAM device 10, all directions will be referenced to an x-and y-coordinate system 100 as shown and to a clockwise rotation direction 94 and a counter-clockwise rotation direction 96. To further simplify the description, it is again assumed that N is equal to two so that MRAM device 10 includes one tri-layer structure in region 15 with magnetic moment vectors 53 and 57, as well as resultant magnetic moment vector 40. Also, only the magnetic moment vectors of region 15 are illustrated since they will be switched.

To illustrate how the writing methods work, it is assumed that a preferred anisotropy axis for magnetic moment vectors 53 and 57 is directed at a 45° angle relative to the negative x-and negative y-directions and at a 45° angle relative to the positive x-and positive y-directions. As an example, FIG. 2 shows that magnetic moment vector 53 is directed at a 45° angle relative to the negative x-and negative y-directions. Since magnetic moment vector 57 is generally oriented anti-parallel to magnetic moment vector 53, it is directed at a 45° angle relative to the positive x-and positive y-directions. This initial orientation will be used to show examples of the writing methods, as will be discussed presently.

In the preferred embodiment, a write word current 60 is defined as being positive if flowing in a positive x-direction and a write bit current 70 is defined as being positive if flowing in a positive y-direction. The purpose of write word line 20 and write bit line 30 is to create a magnetic field within MRAM device 10. A positive write word current 60 will induce a circumferential write word magnetic field, $H_W$ 80, and a positive write bit current 70 will induce a circumferential write bit magnetic field, $H_B$ 90. Since, in this example, write word line 20 is above MRAM device 10, in the plane of the element, $H_W$ 80 will be applied to MRAM device 10 in the positive y-direction for a positive write word current 60. Similarly, since write bit line 30 is below MRAM device 10, in the plane of the element, $H_B$ 90 will be applied to MRAM device 10 in the positive x-direction for a positive write bit current 70. It will be understood that the definitions for positive and negative current flow are arbitrary and are defined here for illustrative purposes. The effect of reversing the current flow is to change the direction of the magnetic field induced within MRAM device 10. The behavior of a current induced magnetic field is well known to those skilled in the art and will not be elaborated upon further here.

Figure 3:
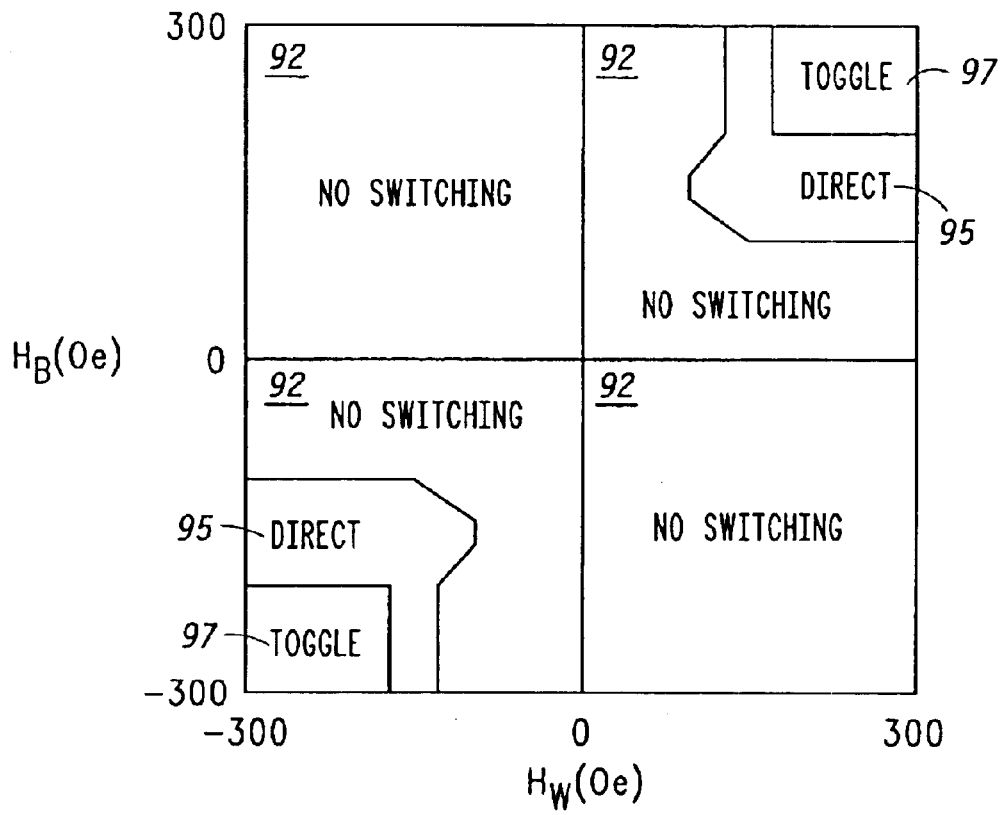
FIG. 3 is a graph illustrating a simulation of the magnetic field amplitude combinations that produce the direct or toggle write mode in the magnetoresistive random access memory device.
Figure 4:
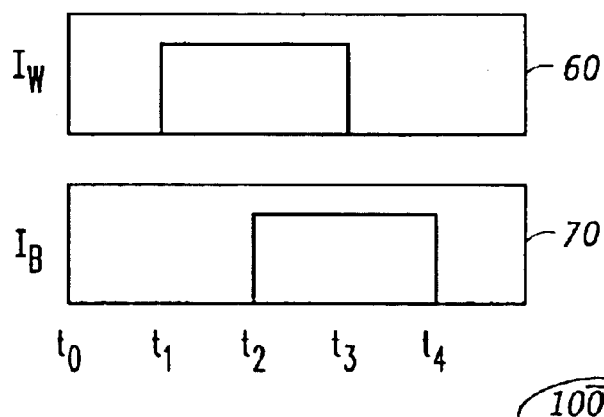

Turn now to FIG. 3, which illustrates the simulated switching behavior of a SAF tri-layer structure. The simulation consists of two single domain magnetic layers that have close to the same moment (a nearly balanced SAF) with an intrinsic anisotropy, are coupled anti-ferromagnetically, and whose magnetization dynamics are described by the Landau-Lifshitz equation. The x-axis is the write word line magnetic field amplitude in Oersteds, and the y-axis is the write bit line magnetic field amplitude in Oersteds. The magnetic fields are applied in a pulse sequence 101 as shown in FIG. 4 wherein pulse sequence 101 includes write word current 60 and write bit current 70 as functions of time.

There are three regions of operation illustrated in FIG. 3. In a region 92 there is no switching. For MRAM operation in a region 95, the direct writing method is in effect. When using the direct writing method, there is no need to determine the initial state of the MRAM device because the state is only switched if the state being written is different from the state that is stored. The selection of the written state is determined by the direction of current in both write word line 20 and write bit line 30. For example, if a '1' is desired to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the write word and write bit lines. Hence, either state can be programmed to the desired '1' or '0'with the appropriate polarity of current pulses, regardless of its initial state. Throughout this disclosure, operation in region 95 will be defined as "direct write mode".

For MRAM operation in a region 97, the toggle writing method is in effect. When using the toggle writing method, there is a need to determine the initial state of the MRAM device before writing because the state is switched every time the MRAM device is written to, regardless of the direction of the currents as long as the same polarity current pulses are chosen for both write word line 20 and write bit line 30. For example, if a '1' is initially stored then the state of the device will be switched to a '0' one positive current pulse sequence is flowed through the write word and write bit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. MRAM device 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device. Throughout this disclosure, operation in region 97 will be defined as "toggle write mode".

Both writing methods involve supplying currents in write word line 20 and write bit line 30 such that magnetic moment vectors 53 and 57 can be oriented in one of two preferred directions as discussed previously. To fully elucidate the two switching modes, specific examples describing the time evolution of magnetic moment vectors 53, 57, and 40 are now given.

Figure 5:
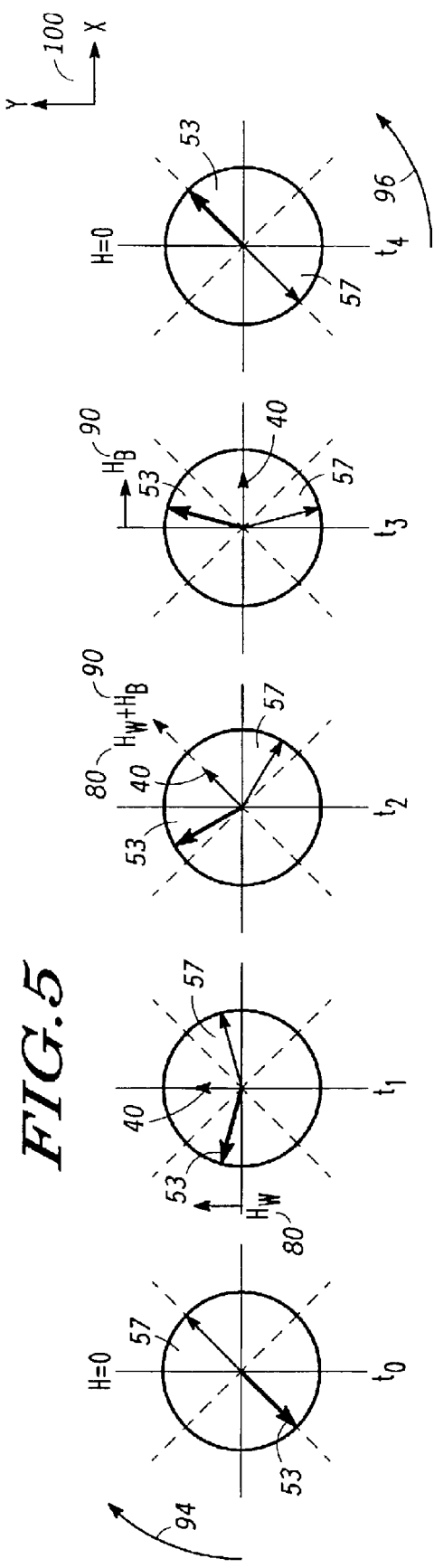
FIG. 5 is a diagram illustrating the rotation of the magnetic moment vectors for a magnetoresistive random access memory device for the toggle write mode when writing a '1' to a '0'.

Turn now to FIG. 5 which illustrates the toggle write mode for writing a '1' to a '0' using pulse sequence 100. In this illustration at time $t_0$, magnetic moment vectors 53 and 57 are oriented in the preferred directions as shown in FIG. 2. This orientation will be defined as a '1'.

At a time $t_1$, a positive write word current 60 is turned on, which induces $H_W$ 80 to be directed in the positive y-direction. The effect of positive $H_W$ 80 is to cause the nearly balanced anti-aligned MRAM tri-layer to "FLOP" and become oriented approximately 90° to the applied field direction. The finite anti-ferromagnetic exchange interaction between ferromagnetic layers 45 and 55 will allow magnetic moment vectors 53 and 57 to now deflect at a small angle toward the magnetic field direction and resultant magnetic moment vector 40 will subtend the angle between magnetic moment vectors 53 and 57 and will align with $H_W$ 80. Hence, magnetic moment vector 53 is rotated in clockwise direction 94. Since resultant magnetic moment vector 40 is the vector addition of magnetic moment vectors 53 and 57, magnetic moment vector 57 is also rotated in clockwise direction 94.

At a time $t_2$, positive write bit current 70 is turned on, which induces positive $H_B$ 90. Consequently, resultant magnetic moment vector 40 is being simultaneously directed in the positive y-direction by $H_W$ 80 and the positive x-direction by $H_B$ 90, which has the effect of causing effective magnetic moment vector 40 to further rotate in clockwise direction 94 until it is generally oriented at a 45° angle between the positive x-and positive y-directions. Consequently, magnetic moment vectors 53 and 57 will also further rotate in clockwise direction 94.

At a time $t_3$, write word current 60 is turned off so that now only $H_B$ 90 is directing resultant magnetic moment vector 40, which will now be oriented in the positive x-direction. Both magnetic moment vectors 53 and 57 will now generally be directed at angles passed their anisotropy hard-axis instability points.

At a time $t_4$, write bit current 70 is turned off so a magnetic field force is not acting upon resultant magnetic moment vector 40. Consequently, magnetic moment vectors 53 and 57 will become oriented in their nearest preferred directions to minimize the anisotropy energy. In this case, the preferred direction for magnetic moment vector 53 is at a 45° angle relative to the positive y-and positive x-directions. This preferred direction is also 180° from the initial direction of magnetic moment vector 53 at time $t_0$ and is defined as '0'. Hence, MRAM device 10 has been switched to a '0'. It will be understood that MRAM device 10 could also be switched by rotating magnetic moment vectors 53, 57, and 40 in counter clockwise direction 96 by using negative currents in both write word line 20 and write bit line 30, but is shown otherwise for illustrative purposes.

Figure 6:
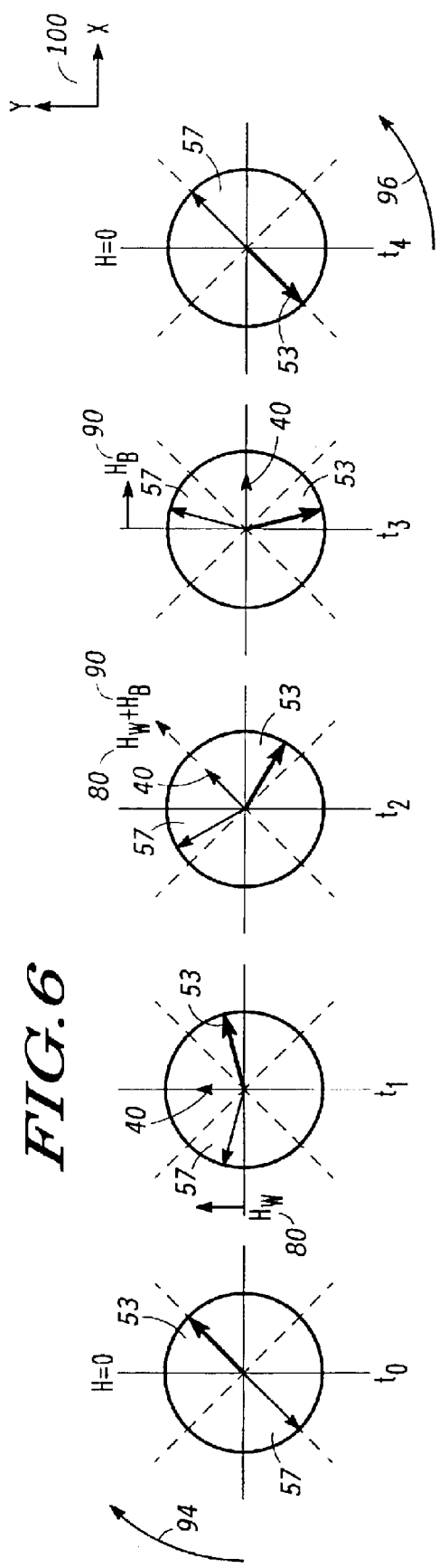
FIG. 6 is a diagram illustrating the rotation of the magnetic moment vectors for a magnetoresistive random access memory device for the toggle write mode when writing a '0' to a '1'.

Turn now to FIG. 6 which illustrates the toggle write mode for writing a '0' to a '1' using pulse sequence 100. Illustrated are the magnetic moment vectors 53 and 57, as well as resultant magnetic moment vector 40, at each of the times $t_0$, $t_1$, $t_2$, $t_3$, and $t_4$ as described previously showing the ability to switch the state of MRAM device 10 from '0' to '1' with the same current and magnetic field directions. Hence, the state of MRAM device 10 is written to with toggle write mode, which corresponds to region 97 in FIG. 3.

For the direct write mode, it is assumed that magnetic moment vector 53 is larger in magnitude than magnetic moment vector 57, so that magnetic moment vector 40 points in the same direction as magnetic moment vector 53, but has a smaller magnitude in zero field. This unbalanced moment allows the dipole energy, which tends to align the total moment with the applied field, to break the symmetry of the nearly balanced SAF. Hence, switching can occur only in one direction for a given polarity of current.

Figure 7:
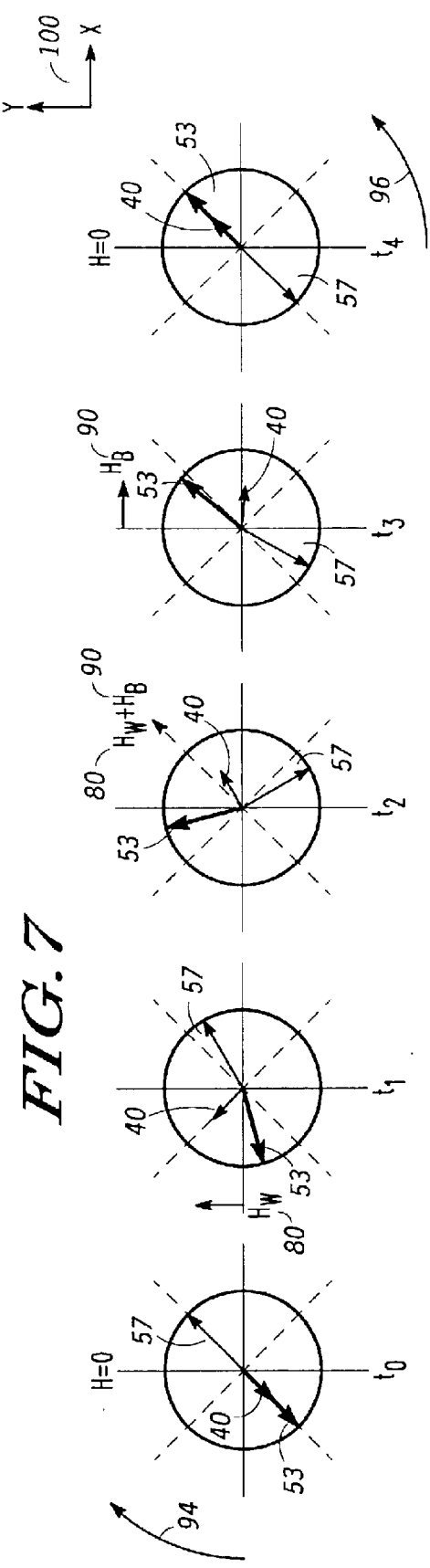
FIG. 7 is a graph illustrating the rotation of the magnetic moment vectors for a magnetoresistive random access memory device for the direct write mode when writing a '1' to a '0'.

Turn now to FIG. 7 which illustrates an example of writing a '1' to a '0' using the direct write mode using pulse sequence 100. Here again, the memory state is initially a '1' with magnetic moment vector 53 directed 45° with respect to the negative x-and negative y-directions and magnetic moment vector 57 directed 45° with respect to the positive x-and positive y-directions. Following the pulse sequence as described above with positive write word current 60 and positive write bit current 70, the writing occurs in a similar manner as the toggle write mode as described previously. Note that the moments again 'FLOP' at a time $t_1$, but the resulting angle is canted from 90° due to the unbalanced moment and anisotropy. After time $t_4$, MRAM device 10 has been switched to the '0' state with resultant magnetic moment 40 oriented at a 45° angle in the positive x-and positive y-directions as desired. Similar results are obtained when writing a '0' to a '1' only now with negative write word current 60 and negative write bit current 70.

Figure 8:
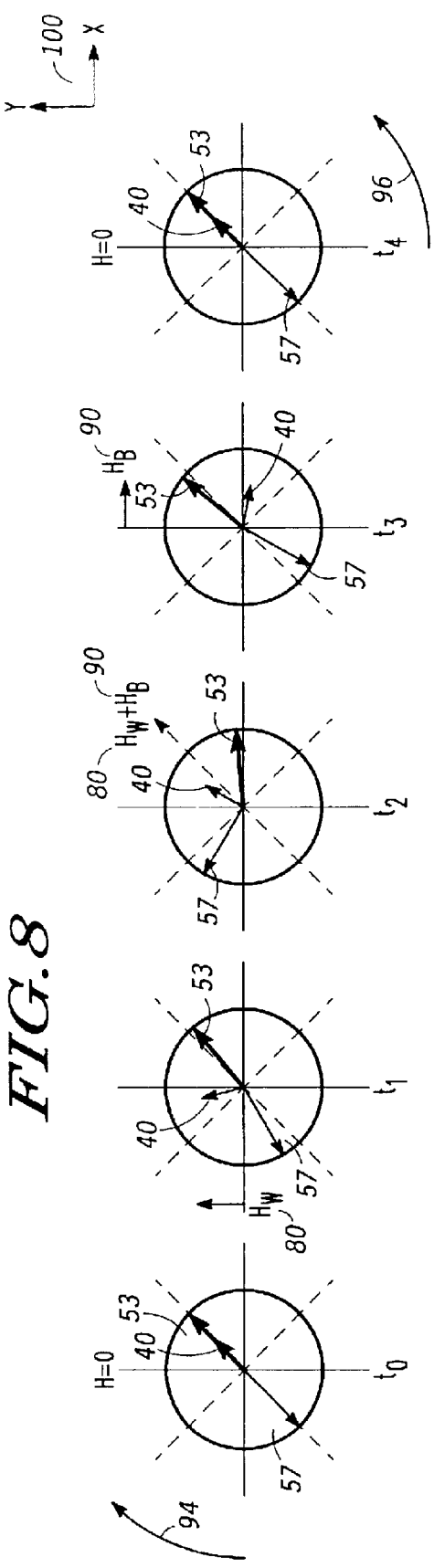
FIG. 8 is a graph illustrating the rotation of the magnetic moment vectors for a magnetoresistive random access memory device for the direct write mode when writing a '0' to a state that is already a '0'.

Turn now to FIG. 8 which illustrates an example of writing using the direct write mode when the new state is the same as the state already stored. In this example, a '0' is already stored in MRAM device 10 and current pulse sequence 100 is now repeated to store a '0'. Magnetic moment vectors 53 and 57 attempt to "FLOP" at a time $t_1$, but because the unbalanced magnetic moment must work against the applied magnetic field, the rotation is diminished. Hence, there is an additional energy barrier to rotate out of the reverse state. At time $t_2$, the dominant moment 53 is nearly aligned with the positive x-axis and less than 45° from its initial anisotropy direction. At a time $t_3$, the magnetic field is directed along the positive x-axis. Rather than rotating further clockwise, the system now lowers its energy by changing the SAF moment symmetry with respect to the applied field. The passive moment 57 crosses the x-axis and the system stabilizes with the dominant moment 53 returned to near its original direction. Therefore, at a time $t_4$ when the magnetic field is removed, and the state stored in MRAM device 10 will remain a '0'. This sequence illustrates the mechanism of the direct write mode shown as region 95 in FIG. 3. Hence, in this convention, to write a '0' requires positive current in both write word line 60 and write bit line 70 and, conversely, to write a '1' negative current is required in both write word line 60 and write bit line 70.

If larger fields are applied, eventually the energy decrease associated with a flop and scissor exceeds the additional energy barrier created by the dipole energy of the unbalanced moment which is preventing a toggle event. At this point, a toggle event will occur and the switching is described by region 97.

Region 95 in which the direct write mode applies can be expanded, i.e. toggle mode region 97 can be moved to higher magnetic fields, if the times $t_3$ and $t_4$ are equal or made as close to equal as possible. In this case, the magnetic field direction starts at 45° relative to the bit anisotropy axis when write word current 60 turns on and then moves to parallel with the bit anisotropy axis when write bit current 70 turns on. This example is similar to the typical magnetic field application sequence. However, now write word current 60 and write bit current 70 turn off substantially simultaneously, so that the magnetic field direction does not rotate any further. Therefore, the applied field must be large enough so that the resultant magnetic moment vector 40 has already moved past its hard-axis instability point with both write word current 60 and write bit current 70 turned on. A toggle writing mode event is now less likely to occur, since the magnetic field direction is now rotated only 45°, instead of 90° as before. An advantage of having substantially coincident fall times, $t_3$ and $t_4$, is that now there are no additional restrictions on the order of the field rise times $t_1$ and $t_2$. Thus, the magnetic fields can be turned on in any order or can also be substantially coincident.

Figure 9:
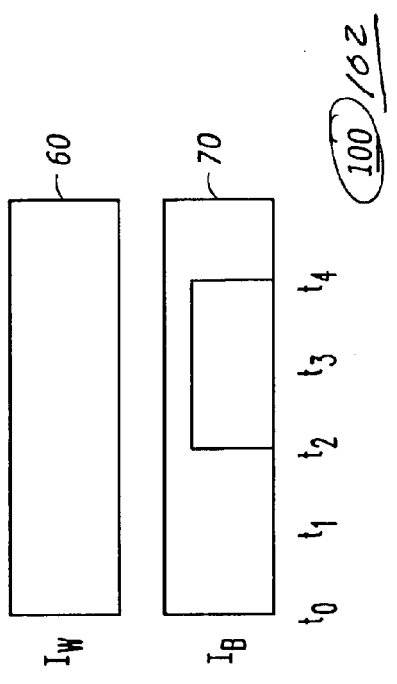
Figure 10:
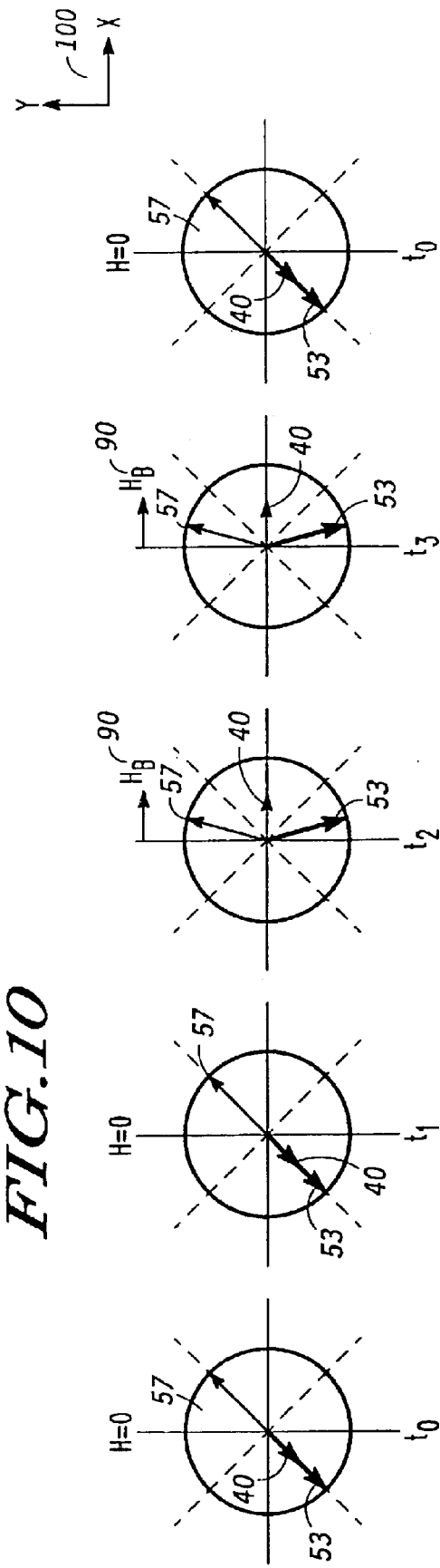

The writing methods described previously are highly selective because only the MRAM device that has both write word current 60 and write bit current 70 turned on between time $t_2$ and time $t_3$ will switch states. This feature is illustrated in FIGS. 9 and 10. FIG. 9 illustrates pulse sequence 102 when write word current 60 is not turned on and write bit current 70 is turned on. FIG. 10 illustrates the corresponding behavior of the state of MRAM device 10. At a time $t_0$, magnetic moment vectors 53 and 57, as well as resultant magnetic moment vector 40, are oriented as described in FIG. 2. In pulse sequence 102, write bit current 70 is turned on at a time $t_2$. During this time, $H_B$ 90 will cause resultant magnetic moment vector 40 to be directed in the positive x-direction.

Since write word current 60 is never switched on, resultant magnetic moment vectors 53 and 57 are never rotated through their anisotropy hard-axis instability points. As a result, magnetic moment vectors 53 and 57 will reorient themselves in the nearest preferred direction when write bit current 70 is turned off at a time $t_3$, which in this case is the initial direction at time $t_0$. Hence, the state of MRAM device 10 is not switched. It will be understood that the same result will occur if write word current 60 is turned on at similar times described above and write bit current 70 is not turned on. This feature ensures that only one MRAM device in an array will be switched, while the other devices will remain in their initial states. As a result, unintentional switching is avoided and the bit error rate is minimized.

Figure 11:
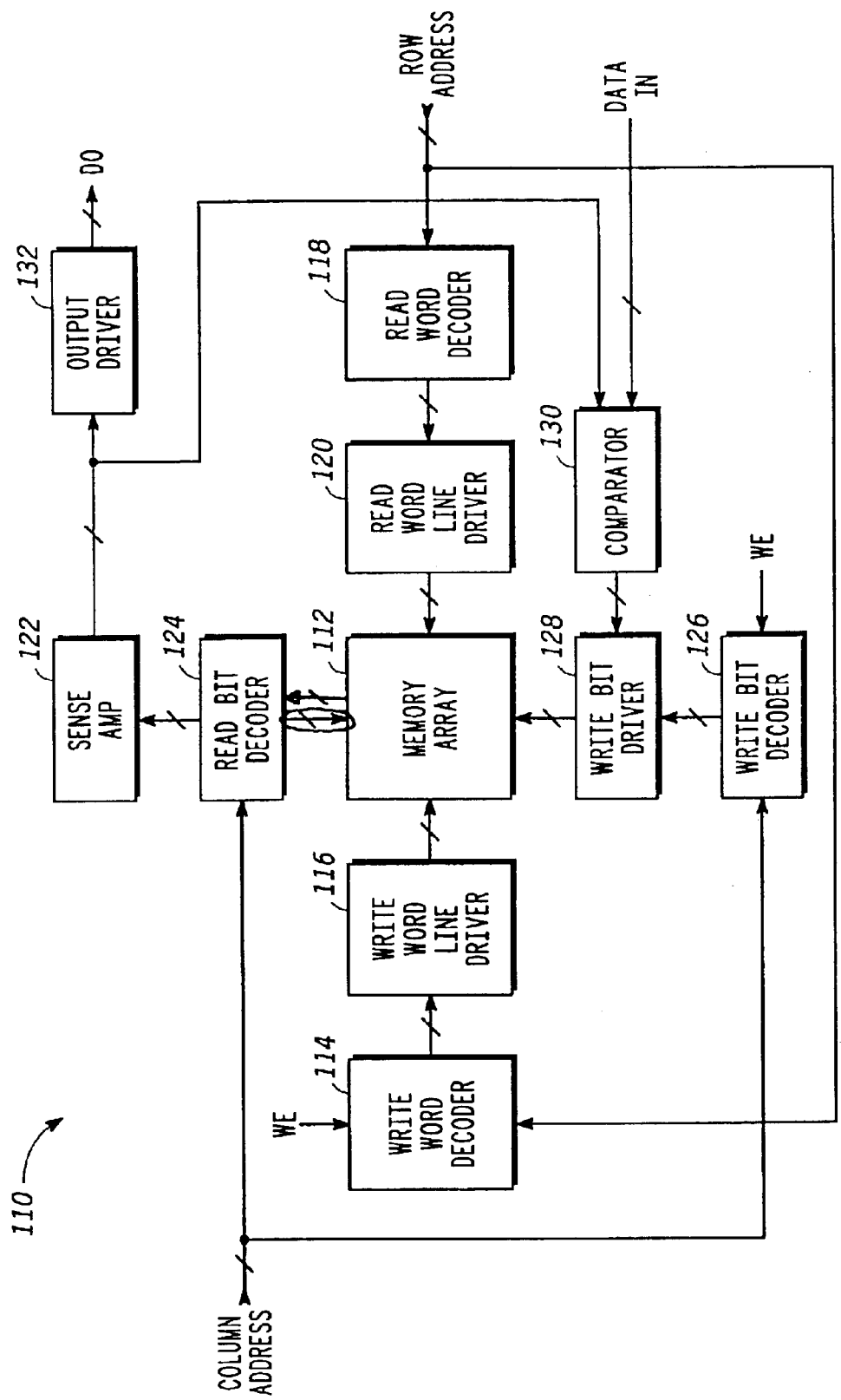
FIG. 11 is a block diagram of a toggle memory.

Shown in FIG. 11 is a memory 110 comprising a memory array 112, a write word decoder 114, a write word line driver 116, a read word decoder 118, a read word line driver 120, one or more sense amplifiers 122, a read bit decoder 124, a write bit decoder 126, a write bit driver 128, a comparator 130, and an output driver 132. These elements are coupled together by multiple lines. For example read bit decoder 124 receives a column address made up of multiple address signals. Memory array 112 is an array of memory cells that can be switched with a toggle operation. A section of memory cells for the memory array 112 is memory array 200 shown in FIG. 14, which is an MRAM cell array that is written in the method described for memory array 3 of FIG. 1 in that writing occurs in four steps of 45° angles until 180° is reached. In this particular preferred cell array, there are separate word lines and bit lines for a write operation and a read operation.

Read word decoder 118 receives a row address and is coupled to read word line driver 120, which in turn is coupled to memory array 112. For a read, read word decoder 118 selects a read word line in memory array 112 based on the row address. The selected word line is driven by read line driver 120. Read bit decoder 124, which receives the column address and is coupled between sense amplifier 122 and memory array 112, selects a read bit line from read bit decoder 124, based on the column address, from memory array 112 and couples it to sense amplifier 122. Sense amplifier 122 detects the logic state and couples it to output driver 132 and comparator 130. Output driver 132, for a read, provides a data output signal DO. For a write operation, comparator 130 compares the logic state of the selected cell, which is provided by sense amplifier 122, to the desired logic state to be written as provided by the data in.

Write word decoder 114 receives the row address and is coupled to write word line driver 116, which in turn is coupled to memory array 112. For a write, write word decoder 114 selects a write word line, based on the row address, in memory array 112, and write word line driver in turn drives that selected write word line. Write bit decoder 126 receives the column address and is coupled to the write bit driver 128, which is coupled to the memory array 112. Writer bit decoder 126 selects a write bit line, based on the column address, and write bit driver 128 in turn drives the selected write bit line in order to toggle the state of the selected cell.

Since memory array 112 is a toggle memory, a write toggling operation is completed only if the logic state of the cell needs to be flipped in order to achieve the desired resulting logic state for the selected cell. Thus, comparator 130 receives the output of a read operation on the selected cell from sense amplifier 122 and determines if the selected cell already has the desired logic state. If the selected cell, as determined by the row and column address, does have the desired logic state, then the write operation is terminated. If the logic state of the selected cell is different from the desired state then the comparator indicates to write bit driver 128 that the write is to continue and the write bit driver for the selected write bit line drives the selected write bit line.

Figure 12:
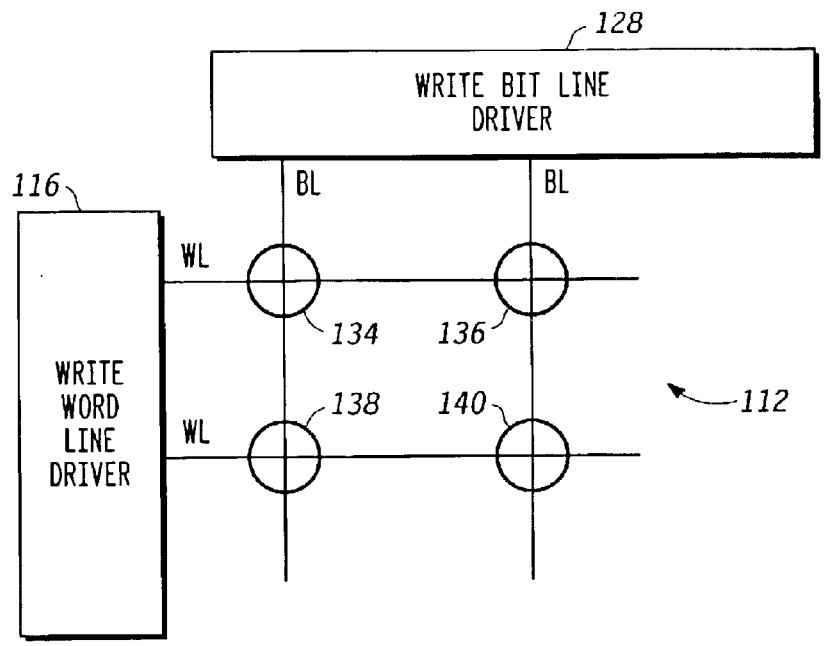
FIG. 12 is a more detailed diagram of a portion of the memory of FIG. 11.

Shown in FIG. 12 is a portion of memory 110 of FIG. 11 comprising the write word line driver 116 coupled to write word lines WL, write bit driver 128 coupled to write bit lines BL, and cells 134, 136, 138, and 140 coupled at intersection of write bit lines BL and write word lines WL. For a write to occur, current is provided to a selected word line WL, while no current is flowing in the selected write bit line, for sufficient time to cause the first angle change in the memory cells along the selected write word line. While current is still flowing in the selected write word line, current is flowed through the selected write bit line to cause the second angle change to the selected memory cell. Only at the intersection of the current carrying write bit line and write word line does this second angle change occur. While current is still flowing through the write bit line, current flow is terminated through the selected write word line to cause a third angle change in the selected memory cell. Only at the intersection of the selected write bit line and the selected write word line does this third change occur. A fourth angle change of the selected memory cell occurs when the current through the selected write bit line is terminated.

Figure 13:
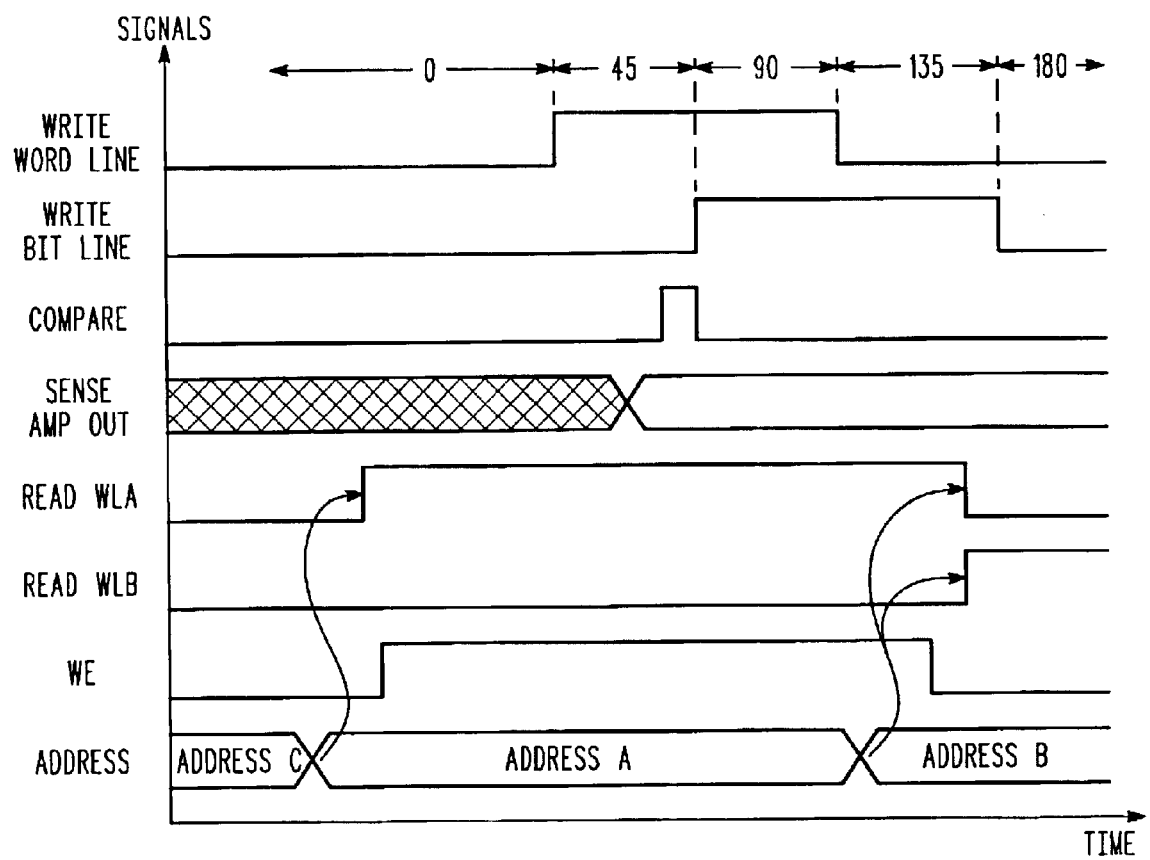
FIG. 13 is a timing diagram useful in understanding the operation of the memory of FIG. 11.

The write operation of memory 110 is further explained by reference to the timing diagram of FIG. 13. Both a read operation and a write toggle operation are initiated by a change in the row or column address as shown by enabling a read word line WLA as shown in FIG. 13. Although the write cannot be executed until it has been determined that the logic state needs to flipped, nonetheless, the write cycle can begin as noted by the write word line being enabled prior to the sense amplifier providing its output and the comparator determining if the logic state needs to be flipped. Enabling (causing current to flow through) the write word line does cause the first angle change in the selected cell as well as all of the cells along the selected write word line, but this change is reversed if the current is terminated without enabling the write bit line.

Thus, the selected write word line can be enabled prior to the comparator making its determination because the first angle change is reversed simply by removing the current. This must be the case because all of the cells on a selected write word line experience the first angle change and all but one are not selected. Only the selected cell, however, experiences the second angle change and that occurs when the write bit line is enabled. This is shown as occurring after the comparator has made its determination that a logic state change is desired. The first angle change is shown as being from 0° to 45° and the second change is from 45° to 90°. The third angle change is shown as occurring when the write word line is disabled (current is terminated). This is shown as being from 90° to 135°. The final angle change shown is the fourth angle change and occurs when the write bit line is disabled. This angle change is shown as being from 135° to 180°.

This also shows that the final stages of the write can continue after the next address change, which initiates another cycle. The beginning of a cycle always begins with a read even if the cycle is a write cycle. Address A is changed to address B and causes read word line B to be selected. This does not interfere with the writing of the previously selected cell. This depicts a read word line change, but even if the address is a column only change so that the selected read word line does not change, the continued flow of current does not adversely affect the completion of the write. Also note that it is not necessary that the write enable be active at the time the cycle begins, because all cycles begin with a read operation anyway. The write enable signal must be active sufficiently early though for the write bit line to become active.

The explanation has been with respect to a single cell being selected, but this was for ease of understanding. In practice, typically a number of cells will be selected and that is indicated in FIG. 11 by the signal connections between the elements being multiple signal lines. Thus, for example, if memory 110 were a x16 memory, comparator 130 would actually make 16 different comparisons, one for each selected cell. Of the sixteen comparisons, only those that indicated a non-match would cause a write operation of those selected cells with the non-match. The selected cells that resulted in a match would not be flipped.

Figure 14:
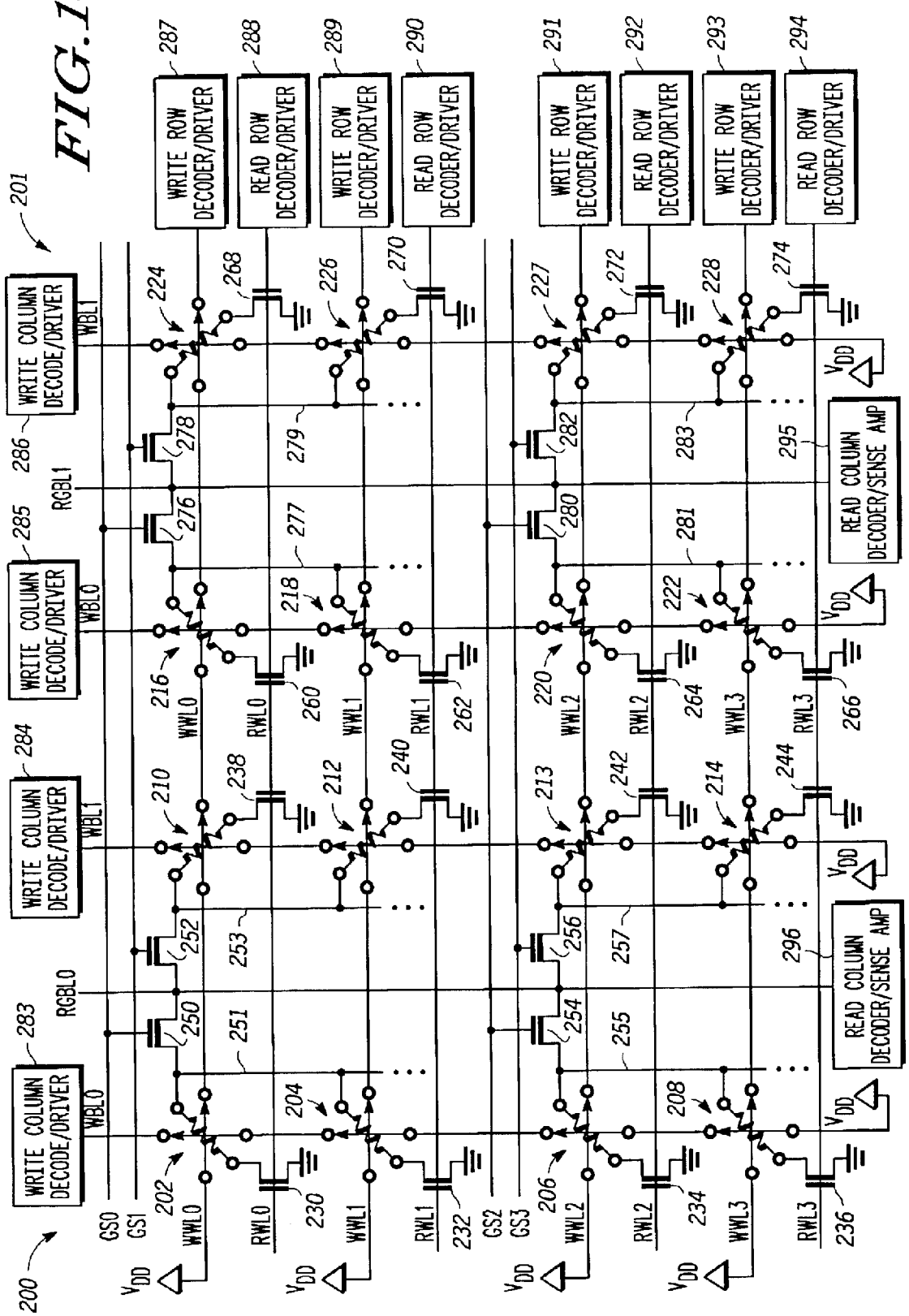
FIG. 14 is a circuit diagram of a portion of the memory of FIG. 11 showing an embodiment of the inventive architecture.

Shown in FIG. 14 is a portion of memory array 200 and a plurality of driver, decoder, and sensing blocks that combine to form a memory core 201. The portion of memory array 200 comprises MRAM devices 202, 204, 206, 208, 210, 212, 213, 214, 216, 218, 220, 222, 224, 226, 227, and 228. Each of these MRAM devices has three current paths. A first current path and second current path of these three paths, which are shown as orthogonal to each other, represent the write paths. These two paths carry the signals, shown in FIGS. 12 and 13, that switch the logic state of the cell. The third current path, which is shown as a resistor at a 45 degree angle, represents a read current path through a magnetoresistive tunnel junction that is programmed to one of two possible resistive states. The memory array 200 further comprises select transistors 230, 232, 234, 236, 238, 240, 242, 244, 260, 262, 264, 266, 268, 270, 272, and 274, that are in series with the third current path, which is the read current path, of corresponding MRAM devices 202, 204, 206, 208, 210, 212, 213, 214, 216, 218, 220, 222, 224, 226, 227, and 228, respectively. This connection of the select transistors is with one current electrode of these transistors coupled to the third current path and the second current electrode coupled to ground (VSS). Each combination of a select transistor device and MRAM device comprises a memory cell.

The memory core 201 comprises write word lines WWL0, WWL1, WWL2, and WWL3 that run through the first current paths of the MRAM devices. WWL0, runs through MRAM devices 202, 210, 216, and 224. WWL1, runs through MRAM devices 204, 212, 218, and 226. WWL2 runs through MRAM devices 206, 213, 220, and 227. WWL3 runs through MRAM devices 208, 214, 222, and 228. Memory array 200 further comprises write bit lines WBL0, WBL1, WBL2, and WBL3 that run through the second current paths of the MRAM devices. WBL0 runs through MRAM devices 202, 204, 206, and 208. WBL1 runs through MRAM devices 210, 212, 213, and 214. WBL2 runs through MRAM devices 216, 218, 220, and 222. WBL3 runs through MRAM devices 224, 226, 227, and 228. Yet further memory array 200 comprises read word lines RWL0, RWL1, RWL2, and RWL3 that are coupled to the gate of the select transistors. RWL0 is coupled to select transistors 230, 238, 260, and 268. RWL1 is coupled to select transistors 232, 240, 262, and 270. RWL2 is coupled to select transistors 234, 242, 264, and 272. RWL3 is coupled to select transistors 236, 244, 266, and 274. Memory array 200 also comprises read global bit lines RGBL0 and RGBL1 group select lines GS0, GS1, GS2, and GS3.

Memory array 200 further comprises group select transistors 250, 252, 254, 256, 276, 278, 280, and 282 that are for coupling groups of memory cells to read global bit lines. Also comprising memory array 200 are local bit lines 251, 253, 255, 257, 277, 279, 281, and 283, which are each coupled to the third current paths of the MRAM devices for their groups. That is, there is one of these local bit lines for each group.

Transistors 250 and 252 have first current electrodes coupled together and to read global bit line RGBL0. Transistors 254 and 256 have first current electrodes coupled together and to read global bit line RGBL0. Transistors 276 and 278 have first current electrodes coupled together and to read global bit line RGBL1. Transistors 280 and 282 have first current electrodes coupled together and to read global bit line RGBL1. Transistors 250, 252, 254, 256, 276, 278, 280, and 282 each have second current electrodes coupled to local bit lines 251, 253, 255, 257, 277, 279, 281, and 283. Local bit lines 251, 253, 255, 257, 277, 279, 281, and 283 are coupled to the third current path of MRAM devices 202 and 204, 206 and 208, 210 and 212, 213 and 214, 216 and 218, 220 and 222, 224 and 226, and 227 and 228, respectively. Group select line GS0, is coupled to group select transistor 250 and 276. Group select line GS1 is coupled to group select transistor 252 and 278. Group select line GS2 is coupled to group select transistor 254 and 280. Group select line GS3 is coupled to group select transistor 256 and 282.

Memory core 201, in addition to memory array 200, comprises write column decoder/drivers 283, 284, 285, and 286; write row decoder/drivers 287, 289, 291, and 293; read row decoder/drivers 288, 290, 292, and 294; and read column decoder/sense amplifiers 295 and 296. Write column decoder/drivers 283, 284, 285, and 286 are connected to write bit lines WBL0, WBL1, WBL2, and WBL3, respectively. Write row decoder/drivers 287, 289, 291, and 293 are coupled to write word lines WWL0, WWL1, WWL2, and WWL3, respectively. Read row decoder/drivers 288, 290, 292, and 294 are coupled to read word lines RWL0, RWL1, RWL2, and RWL3, respectively. Read column decoder/ sense amplifiers 296 and 295 are coupled to read global bit lines RGBL 0 and RGBL 1, respectively.

In operation, an MRAM device, such as MRAM device 202, is written by applying current through a selected write word line, such as WWL0, and a selected write bit line, such as WBL0 in this example, to toggle the state of the memory.

Also, the state can be written directly through WWL0, and WBL0 as well if the memory cell is a direct write cell instead a toggle cell. All of the MRAM devices are selected by flowing current through the write word lines and write bit lines for the particular MRAM device. The state of an MRAM device, such as MRAM device 202, is read by applying a sufficient voltage to the gate of its corresponding select transistor, such as transistor 230 via read word line RWL0 applying a sufficient voltage to the gate of the corresponding group transistor, such as transistor 250 via group select line GS0, and sensing the state of the selected MRAM device, MRAM device 202 in this example via read global bit RGBL0 by column decoder/sense amplifier 296. A group is made up MRAM devices that have their third current paths commonly connected. Thus the capacitance added to the read global bit lines by the cells themselves is limited to the cells that are in the group. Also transistors, 250 and 252 have commonly connected current electrodes, the gates are coupled to different select lines. This has the effect of folding groups to have a common global bit line and having the selection between groups achieved by separate global select lines. Thus there are additional lines in the row direction and fewer in the column direction. The benefit is that the increase in lines in the row direction is one for each group of cells. If the group is 32, which is considered a preferred amount, then there is an additional global select lines for a distance of 32 cells. For the unfolded case, there is one read global bit line for each column instead of one for every two columns for the folded case. Thus, the effect of the unfolded case compared to the folded case is one extra read global bit line for every two columns, which is two cell widths. Thus, the tradeoff is clearly in the favor of the folded bit line. This space advantage can be used to either increase the size of lines to reduce their resistance or decrease the size of the memory core, or a combination of the two.

Further, by separating the write from the read lines, one end of the write lines can be directly connected to a power supply, VDD eliminating a second current switch that is required if the read and write share the same line. Thus, the total area for the write driver is smaller and the average bit size for the memory core is smaller. Also by eliminating the need to switch a line between read and write, the write voltages can be optimized for performance without the risk of damaging the read circuits. Further, because the select transistors do not receive the write voltages, these select transistors can be made to much smaller sizes because they do not have to receive the write-level voltages. This reduces the size of the memory cell. This is particularly significant, when it is common to have transistors made differently for differing voltage requirements.

Figure 15:
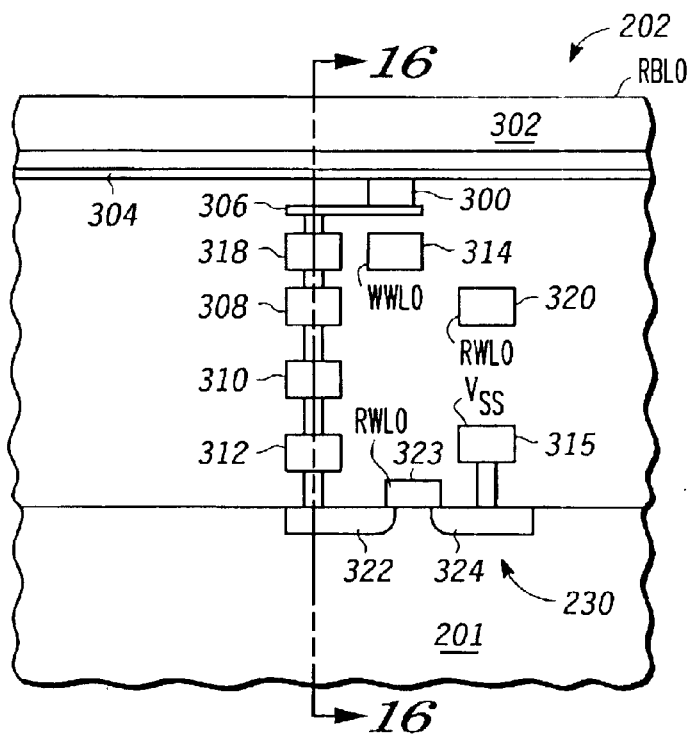
FIG. 15 is a first cross section of a memory cell used in the implementation of the architecture of FIG. 14.

Shown in FIG. 15 is a cross section of a memory cell comprised of MRAM device 202 and transistor 230. This shows the common elements of a MRAM device arranged to take advantage of the architecture of FIG. 14. In a typical application of MRAM technology, the MRAM devices will be present on a circuit with extensive logic such as a microprocessor. In such a case there would be several levels of metal to accommodate the logic design and the storage element of the MRAM device would be manufactured after those metal layers have been formed. This is due to the typical tunnel junction not being able to handle temperatures above about 400 degrees Celsius without degradation.

MRAM device 202 comprises a tunnel junction 300, interconnect 306, and interconnect 304, and write current paths 314 and 302. Interconnect 304 is also local bit line 251. Transistor 230 comprises a source 324, a drain 322, and a gate 323. The drain 322 of transistor 230 is connected to MRAM device 202 via an interconnect 318, an interconnect 308, an interconnect 310, and an interconnect 312, which are formed as metal layers for use as logic. These metal interconnect layers are connected together by vias as is well known. Write current path 314 is formed in the same metal layer as interconnect 318. Gate 323 is part of the read word line RWL0 periodically connected to interconnect 320. The use of interconnect 320 is to reduce the resistance of RWL0. This is a common strapping technique to avoid the relatively high resistance of polysilicon.

Figure 16:
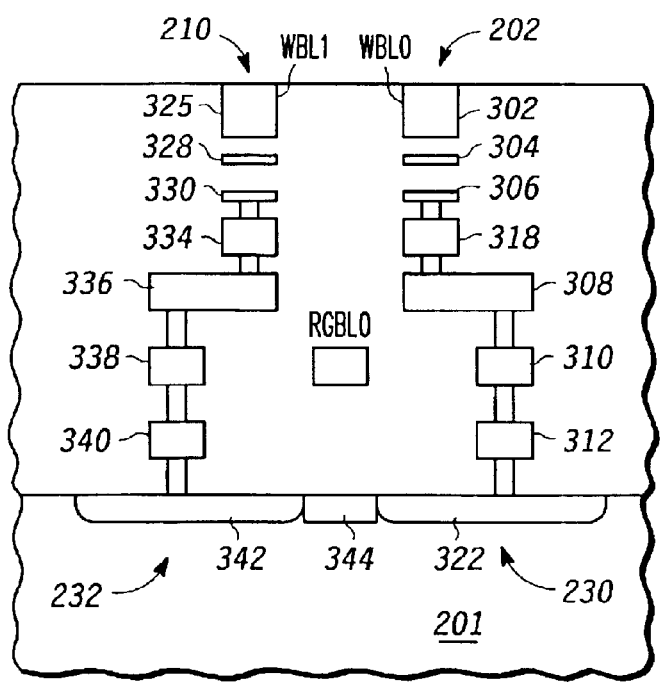
FIG. 16. is a second cross section of the memory cell of FIG. 15 and also shows another memory cell used in the implementation of the architecture of FIG. 14.

Shown in FIG. 16 is cross section taken through MRAM device 202 and transistor 230 as indicated in FIG. 15. This cross section is extended to include MRAM device 210 and transistor 238. This shows read global bit line RGBL0 at the same level of interconnect as interconnect 310. Notice that tunnel junction 300 and WWL0, are offset from the cross section line and so are not present in FIG. 16. The portion of MRAM device 210 present in FIG. 16 is write bit line WBL1. Similar to MRAM device 202, the third current path of MRAM device 210 is connected to transistor 232 by interconnect 340, interconnect 338, interconnect 336, interconnect 334, and interconnect 330. Interconnect 330 and 306 provide the direct connection to the tunnel junctions of MRAM devices 210 and 202, respectively. These cross sections show that this architecture can be made without requiring unusual structures that would require special processing.

Figure 17:
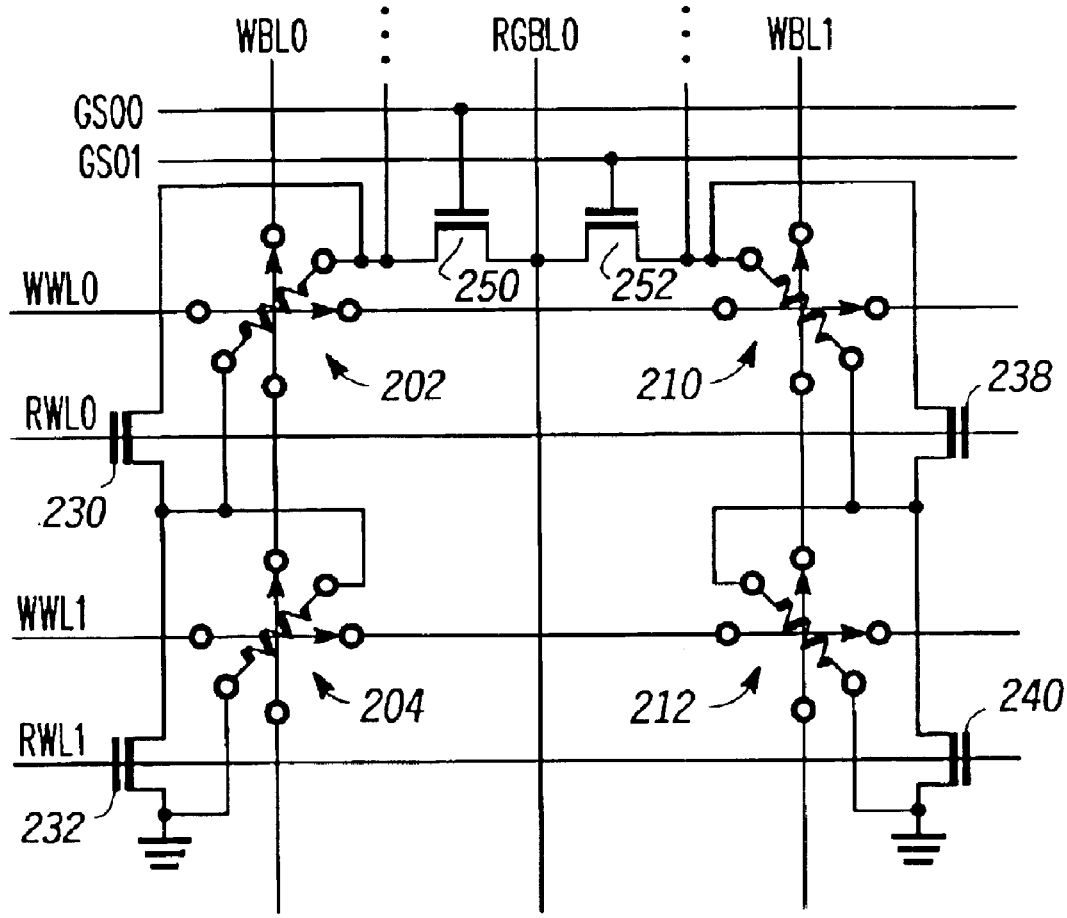
FIG. 17 is a circuit diagram showing a variation on the circuit diagram of FIG. 14.

Shown in FIG. 17 is a portion of an alternative to that shown in FIG. 14. In this case the memory cells in each group are arranged as a series memory. Each of the plurality of groups of adjacent bit cells is connected in series to a reference. In this case the reference is ground. There is no local bit line in this alternative. Similar device numbers are retained for similar features.

Figure 18:
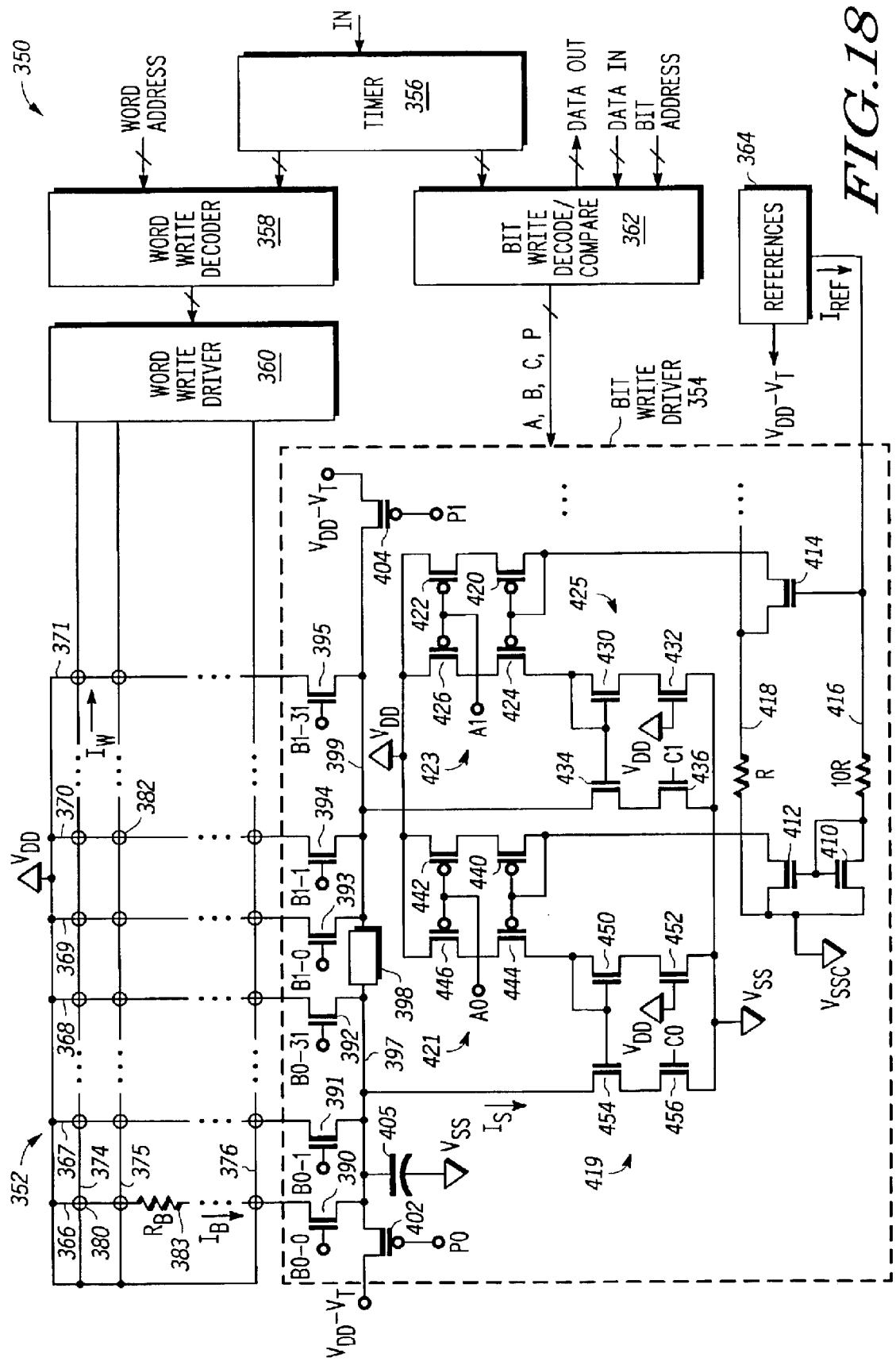
FIG. 18 is a partial schematic diagram of another embodiment of an inventive MRAM architecture.

Illustrated in FIG. 18 is an MRAM architecture 350 generally having an array 352, a bit write driver 354, a timer 356, a word write decoder 358, a word write driver 360, a bit write decode/compare 362, and references 364. It should be well understood that read circuitry associated with MRAM architecture 350 is not illustrated for purposes of simplification to explain a write or program operation.

Array 352 has a plurality of parallel write bit lines such as write bit lines 366, 367, 368, 369, 370 and 371. Array 352 also has a plurality of write word lines such as write word lines 374, 375 and 376. At the intersection of each word line and bit line is an MRAM memory cell that is illustrated for purposes of convenience simply as a circle. A power supply, $V_{DD}$, is connected to each bit line and to each word line. Each of the MRAM memory cells is programmed by the use of a bit line current, Ib, and a word line current Iw. Also, each bit line has a significant parasitic resistance, Rb, associated therewith.

Within bit write driver 354 is a plurality of bit line or column select transistors, such as write column decode transistor switches 390–395, each having a gate controlled by a control signal provided by a bit write decode/compare circuit 362. A drain of transistor 390 is connected to a bottom memory cell in bit line 366, a gate connected to a control signal B0-0, and a source connected to a first common rail 397. A drain of transistor 391 is connected to a bottom memory cell in bit line 367, a gate connected to a control signal B0-1, and a source connected to the first common rail 397. A drain of transistor 392 is connected to a bottom memory cell in bit line 368, a gate connected to a control signal B0-31, and a source connected to the first common rail 397. A drain of transistor 393 is connected to a bottom memory cell in bit line 369, a gate connected to a control signal B1-0, and a source connected to a second common rail 399. A drain of transistor 394 is connected to a bottom memory cell in bit line 370, a gate connected to a control signal B1-1, and a source connected to the second common rail 399. A drain of transistor 395 is connected to a bottom memory cell in bit line 371, a gate connected to a control signal B1-31, and a source connected to the second common rail 399. A metal option 398 is connected to each of the first common rail 397 and the second common rail 399 for selectively connecting the first common rail 397 to the second common rail 399. It should be well understood that variations of the implementation of metal option 398 may be readily used. For example, for reasons that will be discussed below, the first common rail 397 and the second common rail 399 may be initially connected together by a programmable fuse and then selectively blown and disconnected if desired for the reasons described below. A precharge transistor 402 for precharging the first common rail 397 has a source connected to a voltage potential equal to ($V_{DD}$-Vt) where Vt is the threshold voltage of an N-channel transistor used in the column select circuitry. A gate of transistor 402 is connected to a precharge control signal, P0, provided by the Bit Write Decode/Compare circuit 362. A drain of transistor 402 is connected to the first common rail 397. A parasitic capacitance 405 exists between the first common rail 397 and Vss. A precharge transistor 404 for precharging the second common rail 399 has a source connected to the voltage potential equal to ($V_{DD}$-Vt). A gate of transistor 404 is connected to a precharge control signal, P1, provided by the Bit Write Decode/Compare circuit 362. A drain of transistor 404 is connected to the second common rail 399.

A References circuit 364 provides a reference current, Iref, via a conductor 416 to a drain of a transistor 410. The drain of transistor 410 is connected to a gate thereof and to the gate of transistor 412. A source of transistor 410 is connected to a clean voltage reference terminal, $V_{ssc}$. A source of transistor 412 is connected to the clean voltage reference terminal, $V_{ssc}$. Transistor 412 also has a drain. A gate of transistor 414 is connected to the conductor 416. A source of transistor 414 is connected to a conductor 418. A parasitic resistance of conductor 416 between the gate of transistor 414 and the gate of transistor 410 is approximately ten times greater than a parasitic resistance of conductor 418 between the source of transistor 414 and $V_{ssc}$.

A drain of transistor 414 is connected to a drain of a transistor 420 having a gate thereof connected to the drain of transistor 420 and to a gate of transistor 424. A source of transistor 420 is connected to a drain of a transistor 422. A source of transistor 422 is connected to $V_{DD}$. A source of transistor 424 is connected to a drain of a transistor 426. A gate of transistor 422 is connected to a gate of transistor 426 for receiving a control signal labeled A1 provided by the Bit Write Decode/Compare circuit 362. A source of transistor 426 is connected to $V_{DD}$. The drain of transistor 424 is connected to a drain of a transistor 430 having its gate connected thereto and to a gate of transistor 434. A source of transistor 430 is connected to a drain of a transistor 432. A gate of transistor 432 is connected to $V_{DD}$ and a source of transistor 432 is connected to $V_{ss}$. A drain of transistor 434 is connected to the second common rail 399. A source of transistor 434 is connected to a drain of a transistor 436. A gate of transistor 436 is connected to a control signal C1 that is provided by the Bit Write Decode/Compare circuit 362. A source of transistor 436 is connected to $V_{ss}$. The drain of transistor 412 is connected to a drain of a transistor 440 having its gate connected thereto and to a gate of transistor 444. A source of transistor 440 is connected to a drain of a transistor 442. A source of transistor 442 is connected to $V_{DD}$. A source of transistor 444 is connected to a drain of a transistor 446. A source of transistor 446 is connected to $V_{DD}$. A gate of transistor 446 is connected to the gate of transistor 442 to form a control terminal for receiving a timing signal A0 provided by the Bit Write Decode/Compare circuit 362. A drain of transistor 444 is connected to a drain of a transistor 450 having a gate connected thereto and to a gate of transistor 454. A source of transistor 450 is connected to a drain of a transistor 452. A source of transistor 452 is connected to $V_{ss}$. A gate of transistor 452 is connected to $V_{DD}$. A source of transistor 454 is connected to a drain of a transistor 456. A gate of transistor 456 is connected to a control signal C0 provided by the Bit Write Decode/Compare circuit 362. A source of transistor 456 is connected to $V_{ss}$. A drain of transistor 454 is connected to the first common rail 397.

The Bit Write Decode/Compare circuit 362 provides the control signals A, B, C and P described herein. A timer 356 has a first output connected to a first input of the Bit Write Decode/Compare circuit 362. Bit Write Decode/Compare circuit 362 has a second input for receiving multi-bit output data, DATA OUT, a third input for receiving multi-bit input data, DATA IN, and a fourth input for receiving a multi-bit Bit Address. A second output of timer 356 is connected to a first input of a word write decoder 358. A second input of word write decoder 358 receives a multi-bit word address. An output of word write decoder 358 is connected to an input of a word write driver 360. The word write driver 360 has a plurality of outputs, each of which is connected to a predetermined row or word line in the memory array 352. In the illustrated form, transistors 402, 404, 446, 444, 442, 440, 426, 422, 424 and 420 are P-channel transistors and all other transistors illustrated in FIG. 18 are N-channel transistors. It should be appreciated that details of the bit write driver are illustrated in FIG. 18. For purposes of simplification, details of the word write driver 360 are not explicitly shown but have an analogous structure as the bit write drivers 354.

In operation, MRAM architecture 350 has a plurality of memory cells, such as memory cell 380, that are organized in rows and columns, each of the plurality of memory cells being located at intersections of the rows and columns. The plurality of write bit lines, such as write bit line 366, intersect with the plurality of write word lines. Each write bit line has a first end and a second end. Similarly, each write word line has a first end and a second end. Current flowing from the first end to the second end on a selected write bit line and a selected write word line results in a write operation to the memory cell that is located at the intersection of the two lines. The first end of the plurality of write bit lines is directly connected to a common node or bus (i.e. rail). In the illustrated form, the common node is a power supply terminal $V_{DD}$. It should be understood that the power supply terminals in FIG. 18 could be reversed and the first end connected to $V_{ss}$. Additionally, there could be provided transistor switches (not shown) to connect the common node at the first end to a predetermined power supply terminal. It should be further appreciated that all of this discussion is equally applicable for the write word lines of FIG. 18.

Data is written to, stored in and read from array 352. Word write decoders enable the word write drivers to select one word line in the array 352 to execute a write operation. Similarly, the bit write decoder/compare circuit 362 enables the bit write driver 354 to select one column or bit line of array 352 to execute the write operation. The addressed memory cell of array 352 is the intersection of the selected bit line and word line. Timer 356 provides relevant timing information to the word write decode 358 and bit write decode/compare circuitry 362. The timing signals generated within timer 356 are designed to be less voltage/temperature (VT) sensitive by using RC time delay elements as will be discussed below in connection with FIG. 20 for generation of the timing signals.

Within the bit write driver 354 there are two bit groupings. The bit lines of a first bit group are connected to the first common rail 397 through individual write column decode switches 390–392. Similarly, the bit lines of a second bit group are connected to the second common rail 399 through individual write column decode switches 393–395. Within bit write driver 354 there is illustrated three stages of series-connected current mirrors wherein half of a first one of the stages, formed by transistors 410, 412 and 414, is continuously conductive, i.e. transistor 410 is continuously conductive. Each common rail 397, 399 is respectively connected to a switchable current mirror stage 419 and a switchable current mirror stage 425. Intervening switchable current mirror stages 421 and 423 are respectively coupled between each of the switchable current mirror stages 419, 425 and the first stage.

Transistors 440, 442, 444 and 446 form switchable current mirror stage 421, and transistors 450, 452, 454 and 456 form switchable current mirror stage 419 of FIG. 18. Transistors 420, 422, 424 and 426 form switchable current mirror stage 423, and transistors 430, 432, 434 and 436 form switchable current mirror stage 425. Both of the three stage series-connected current mirrors are biased from the common references 364. The Iref current reference from references 364 flows through a shared N-channel mirror device, transistor 410, of the first mirror stage to a noise-free, segregated ground terminal labeled $V_{ssc}$ where the "c" stands for "clean". The gate voltage on transistor 410 forms a reference voltage from the Iref current and is coupled to the intervening switchable current mirror stage 421 by setting up a reference current through transistor 412 to $V_{ssc}$. Similarly, the gate voltage on transistor 410 forms a reference voltage from the Iref current and is coupled to the intervening switchable current mirror stage 423 by setting up a reference current through transistor 414 to $V_{ssc}$.

Typically, references 364 are physically located on an integrated circuit in a remote (relatively) location from the other modules illustrated in FIG. 18 because the references 364 are typically shared by other circuitry (not shown). Therefore, the resistance of the conductor carrying Iref from references 364 to the first mirror stage comprising transistors 410, 412 and 414 is significantly large. To minimize resistive voltage drop on this conductor, each of the three current mirror stages in the bit write driver 354 has a predetermined designed current magnification significant enough to make the write drive current sufficiently large (e.g. milliampere range) to perform a write operation thereby allowing Iref current to be minimal (e.g. tens of microamperes). In addition, the reference current Iref through transistor 410 conducts continuously as a standby current. Therefore, minimizing Iref permits a reduction in the amount of standby power consumed. The current mirror ratio from transistors 412 and 414 to transistor 410 as well as in the switchable stages of the current mirrors are for exemplary purposes only shown to be a factor of ten within each mirroring stage. Therefore, the current through each of transistors 412 and 414 is ten times the current through transistor 410. Conductors 416 and 418 are designed so the voltage drop due to parasitic resistance is as equal as possible. In the illustrated form of FIG. 18, conductor 416 is illustrated as having a parasitic resistance that is 10R and conductor 418 is illustrated as having a parasitic resistance that is R, where R is an arbitrary resistance unit. In other words, conductors 416 and 418 are processed to intentionally have physical properties (widths, lengths, depths, material type, etc.) that result in a 10:1 ratio of their parasitic resistances. The presence of a clean (i.e. not subject to voltage transitions from other sources) $V_{ssc}$ ground terminal and the balanced resistive drop on conductors 418 and 416 makes the gate-to-source voltage of transistors 414 and 412 equal to the gate-to-source voltage of transistor 410.

Figure 19:
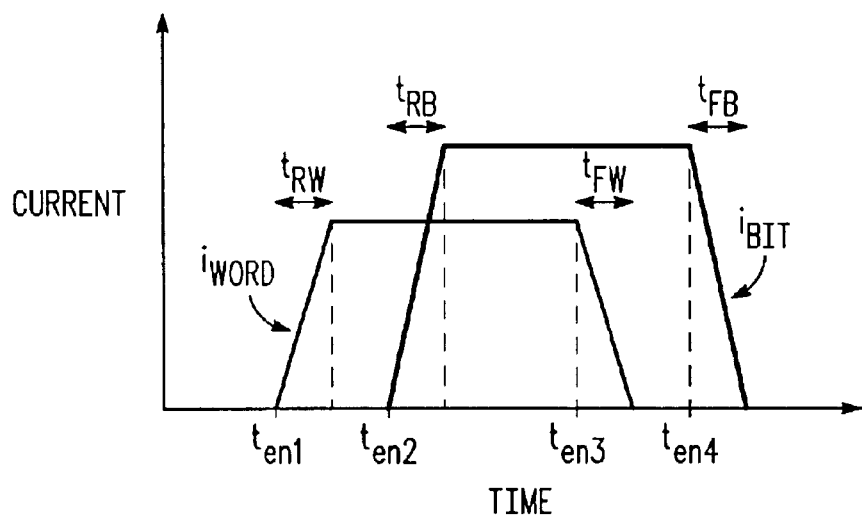
FIG. 19 is a graphical diagram of current pulses required to toggle an MRAM cell.

Illustrated in FIG. 19 is a graph that helps understand the write operation of MRAM architecture 350 of FIG. 18. FIG. 19 illustrates the magnitude and timing relationship between the write word line current and the write bit line current for any of the memory cells of array 352. In the illustrated form, a toggle MRAM write operation will be assumed. In order to perform a write to a predetermined memory cell, it is first necessary at a time $t_{en1}$ to increase write word line current from zero (or a near zero value) to a predetermined magnitude over a fixed transition time tRW. The write word line current is held substantially constant until time $t_{en3}$. In a toggle operation, once a predetermined memory cell is identified from a memory address decode operation and prior to time $t_{en2}$, a determination must be made as to what the existing data value of the address location is. If the new data value is the same logic value as the existing stored value (i.e. a compare step performed in Bit Write Decode/Compare circuit 362), then no write bit line current is applied and a write operation is not fully made for that memory cell. In other words, Bit Write Decode/Compare circuit 362 functions to compare an existing data value (Data Out) with a desired input data value (Data In) for a given address (Bit Address) to determine whether a toggle operation is necessary or not. At a time $t_{en2}$, the write bit line current is increased from zero (or a near zero value) to a predetermined magnitude over a fixed transition time tRB. The magnitude of the word current and the magnitude of the bit current are illustrated as being different for purposes of illustration and clarity, but the two currents may be the same magnitude. The write bit line current is held substantially constant until time $t_{en4}$. At $t_{en3}$ the word line current transitions back to a near zero value over a fixed transition time tFW. At time $t_{en4}$ the bit line current transitions back to a near zero value over a fixed transition time tFB.

Figure 20:
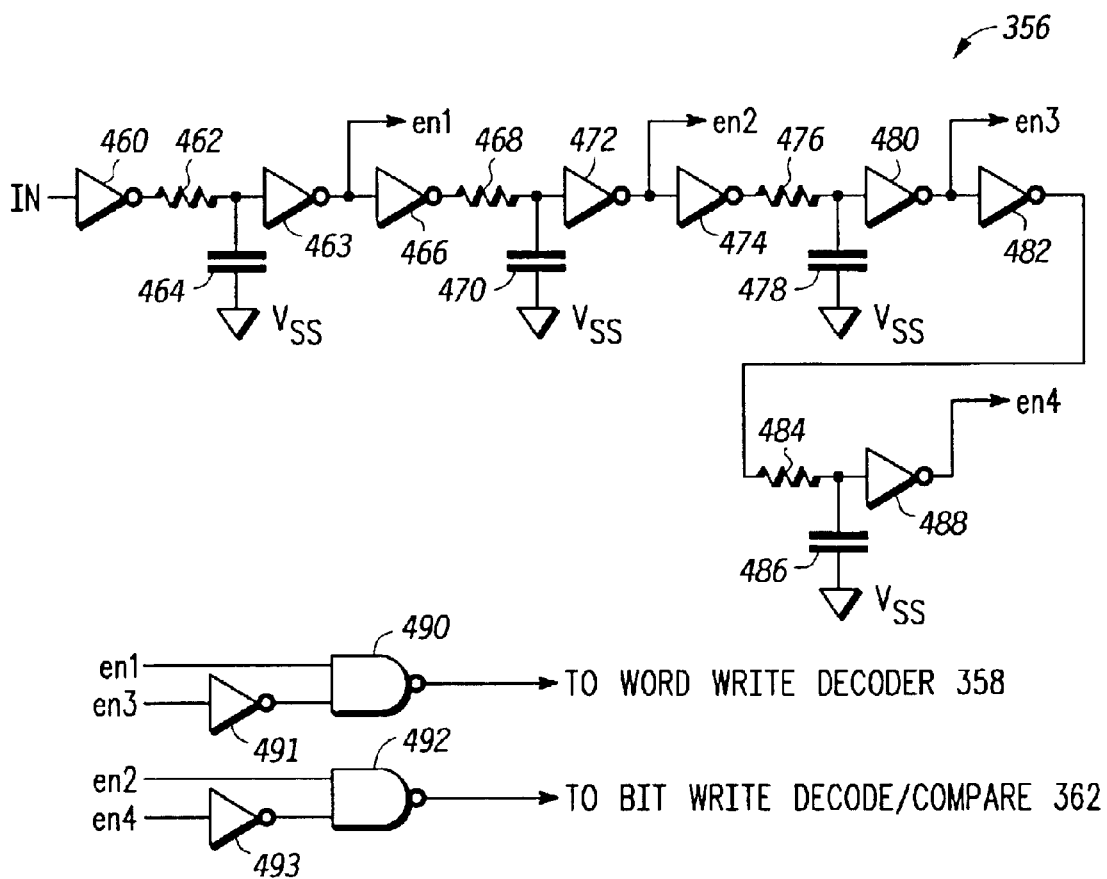
FIG. 20 is a schematic diagram of a delay circuit for use in toggle programming an MRAM cell.

The precise timing of events related to the write operation as defined by $t_{en1}$, $t_{en2}$, $t_{en3}$ and $t_{en4}$ are generated from timer 356 of FIG. 18. A detailed implementation of timer 356 is illustrated in FIG. 20. Timer 356 has an input terminal for receiving an input enable signal, IN, generated from initiation of a write operation. An input of an inverter 460 is connected to the input enable signal. Inverter 460 has an output connected to a first terminal of a resistor 462. A second terminal of resistor 462 is connected to a first electrode of a capacitor 464 and to an input of an inverter 463. A second electrode of capacitor 464 is connected to a voltage reference terminal labeled $V_{ss}$. An output of inverter 463 provides the signal en1 and is connected to an input of an inverter 466. An output of inverter 466 is connected to a first terminal of a resistor 468. A second terminal of resistor 468 is connected to a first electrode of a capacitor 470 and to an input of an inverter 472. A second electrode of capacitor 470 is connected to the $V_{ss}$ voltage reference terminal. An output of inverter 472 provides the signal en2 and is connected to an input of an inverter 474. An output of inverter 474 is connected to a first terminal of a resistor 476. A second terminal of resistor 476 is connected to a first electrode of a capacitor 478 and to an input of an inverter 480. A second electrode of capacitor 478 is connected to the $V_{ss}$ voltage reference terminal. An output of inverter 480 provides the en3 signal and is connected to an input of an inverter 482. An output of inverter 482 is connected to a first terminal of a resistor 484. A second terminal of resistor 484 is connected to a first electrode of a capacitor 486 and to an input of an inverter 488. A second electrode of capacitor 486 is connected to the $V_{ss}$ voltage reference terminal. An output of inverter 488 provides the en4 signal.

Additionally, the en 1 signal is connected to a first input of a NAND gate 490. The en3 signal is connected to an input of an inverter 491. An output of inverter 491 is connected to a second input of NAND gate 490. An output of NAND gate 490 provides a timing signal to the word write decoder 358. The en2 signal is connected to a first input of a NAND gate 492. The en4 signal is connected to an input of an inverter 493. An output of inverter 493 is connected to a second input of NAND gate 492. An output of NAND gate 492 provides a timing signal to the Bit Write Decode/Compare circuit 362.

It is desired to make the relative difference between times $t_{en1}$, $t_{en2}$, $ten_3$ and $t_{en4}$ independent of process, voltage and temperature variations. In operation, timer 356 has a plurality of RC (resistance/capacitance) delay stages. For example, resistor 462 and capacitor 464 form a first RC delay stage. The RC delay stages provide a certain amount of immunity to circuit variations caused by process, voltage and temperature variations. Each delay stage within timer 356 introduces a precise delay from its input terminal to its output terminal and determines a specific one of the en1, en2, en3 and en4 signals. Additionally, the outputs en1–en4 are precisely timed relative to each other. The signals en1–en4 established by timer 356 have timing that corresponds directly with $t_{en1}$–$t_{en4}$ of FIG. 19. Therefore, the timing of signals en1 and en3 establish the initiation and completion of the write word current pulse of FIG. 19. The timing of signals en2 and en4 establish the initiation and completion of the write bit current pulse of FIG. 19. The output of NAND gate 490 is provided to word write decoder 358, and the output of NAND gate 492 is provided to bit write decode/compare 362.

The predetermined current magnitude for the write word line and the write bit line during a write operation requires precise control and is of the order of several milliamperes. The magnitude control function is performed by the bit write driver 354 along with references 364. As discussed previously, the reference current Iref provided by references 364 is magnified through the series-connected current mirror stages of bit write driver 354. To reduce standby leakage current, the second and third stages of the series-connected current mirrors are made switchable. The switchable current mirror stages are turned on by timing signals A and C only during a write operation. The outputs of timer 356 that are connected to the inputs of Bit Write Decode/Compare circuit 362 generate the control timing signals A and C that activate the switchable current mirror stages, and control timing signal B that activates the column decode switches 390–395.

Figure 21:
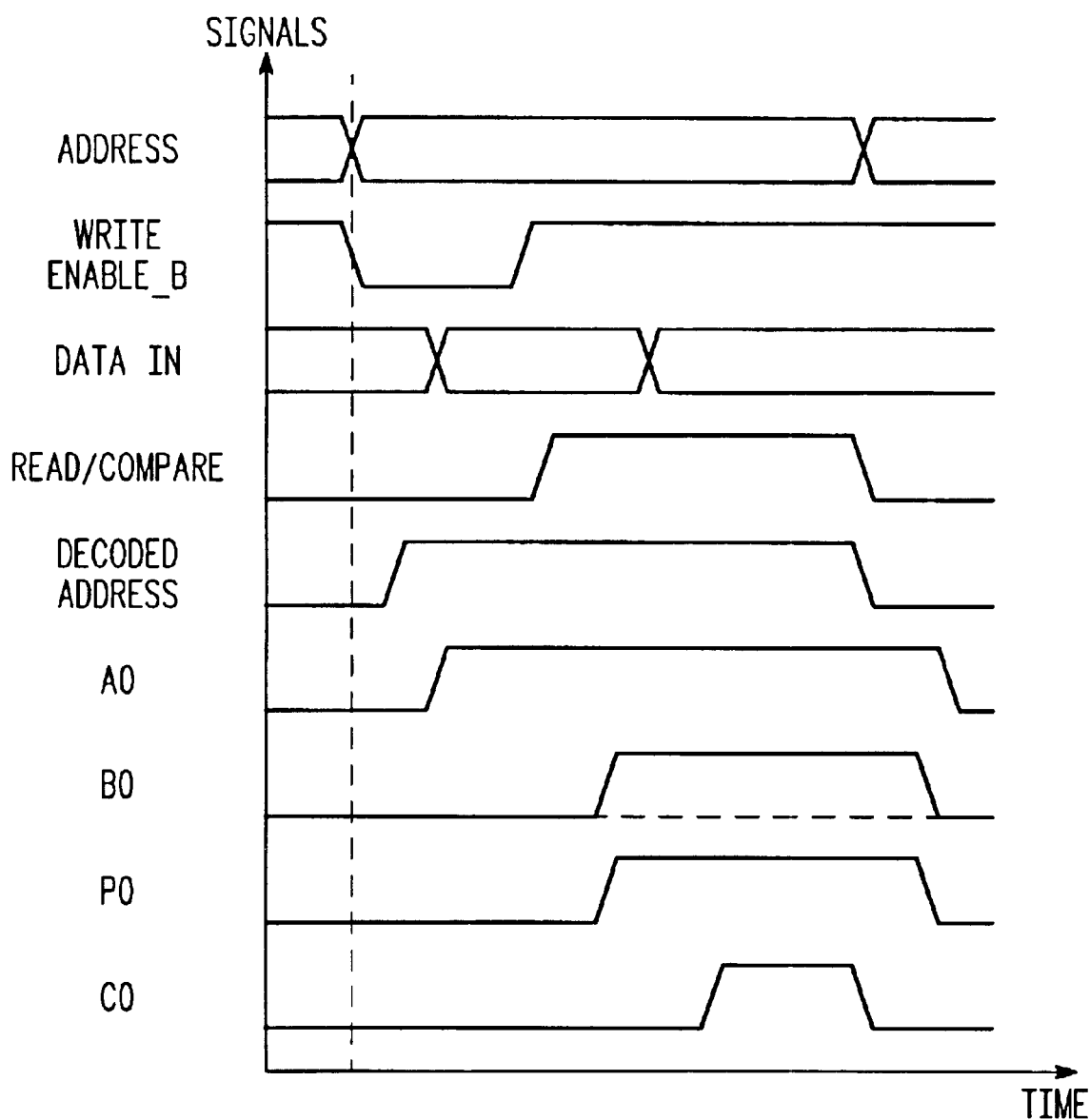
FIG. 21 is a timing diagram of signals associated with the MRAM architecture of FIG. 18 to optimize speed and power conservation during a write operation.

Illustrated in FIG. 21 is the timing associated with the switch control signals A, B and C. In the illustrated form, a Valid address exists in decode logic (not shown). An active low external Write Enable signal has been received by logic circuitry (not shown) that initiates a Write operation. One of the functions initiated with the beginning of a Write operation is the generation of the input signal, IN, to timer 356. The external Write Enable signal only needs to be active for a predetermined amount of time during the illustrated timing example. During a write cycle, a valid data input is provided to the Bit Write Decode/Compare circuit 362. As soon as the decoded address is available to the Bit Write Decode/Compare circuit 362 during a write operation, control signal A (A0 or A1, etc. depending upon the decoded address value) is made active. Control signal A0 turns on the second switchable current mirror stage allowing amplified current from the first current mirror stage to flow into the third switchable current mirror stage that is initially disabled by control signal C0. During this time, the parasitic capacitances associated with the second and third switchable current mirror stages are charged by the resulting current flow and the associated voltages become stable. In the meantime, a Read operation is executed and the data output from the read is provided to the Bit Write Decode/Compare circuit 362. Bit Write Decode/Compare circuit 362 compares the bit inputs from the Data Out signal against the bit inputs from the Data In signal to determine whether a write toggle operation is necessary. Next, the Bit Write Decode/Compare circuit 362 provides an active B control signal by making only one of the B0-0 through B0-31 or B1-0 through B1-31 signals active depending upon the decoded column address. Since C0 is not active, no current flows through the selected Write bit line. In one form, the B signal is made active right after the Read operation is executed. In another form, the B signal may be made active before the Read operation is completed. Once a decision to toggle an addressed memory cell is made by Bit Write Decode/Compare circuit 362, signal C is made active by Bit Write Decode/Compare circuit 362. The activation of signal C turns on transistor 456 or transistor 436 depending upon whether C0 or C1 is made active. At this point current begins to flow through the Write Bit line that has been addressed. It should be again noted that although the discussion herein is devoted exclusively to the write bit line circuitry, the same operation exists for the write word line circuitry (not shown in detail). One difference for the write word line circuitry is that the generation of the C control signal may occur before the decision whether or not to toggle is made.

As explained previously in connection with FIG. 19, once control signal C is activated and current begins to flow through the write bit line, a certain transition time, tRB, is required to change from near zero current to high current flow. The transition time tRB needs to be substantially constant irrespective of the magnitude of the write current, and voltage and temperature variations. The constant transition time is provided by the MRAM architecture 350. The switchable current mirror 419 draws a constant value of current, Is, through the parasitic resistance RB of the Write bit line and the parasitic capacitance 405 of the common rail 397 once control signal C0 is active. Because a constant current, Is, is conducted through resistor RB that functions with the parasitic capacitance 405, an RC network is utilized to make the transition time of the write current IB more insensitive to voltage and temperature variations and therefore be substantially constant. The transition time TRB can be adjusted to different values by varying the value of the RC time constant. This adjustment is accomplished in MRAM architecture 350 by allowing for metal option 398 that directly connects common rail 397 to common rail 399 when used. It should be understood that metal option 398 is a conventional circuit design technique that permits a designer to provide a connection and then create a new photomask containing the connection to implement the connected rail design in an integrated circuit. Other connection techniques may be used rather than a metal option. For example, programmable fuses or transistor switches may be implemented to complete the connections to adjust the transition time TRB as desired. The conductive path doubles the capacitance seen by the constant current Is and therefore doubles the transition time TRB of the write current IB. Although a single metal option is shown connecting two common rails are shown, it should be understood that any number of metal option connections may be used to connect multiple common rail sections.

Referring again to FIG. 19, beyond the transition time the current through the Write bit line maintains a constant predetermined value. This value is determined by the reference current Iref and the magnification factor through the three series-connected current mirror stages. Maintaining a constant current value of the iword and the ibit currents when these currents are at their elevated current values is very important over process, temperature and voltage variations. MRAM cells require precise programming currents and these requirements are not very sensitive to temperature, voltage and many process conditions. Therefore the programming currents must also be insensitive to ensure stable and accurate programming. Therefore, current reference 364 that generates the reference current Iref is made temperature and voltage insensitive by using insensitive circuitry such as a bandgap reference voltage generator.

At the end of the constant current period, $t_{en4}$ in FIG. 19, control signal C0 is deactivated as illustrated in FIG. 21. The transition time tFB is accomplished in the same manner as previously described for transition time tRB. This completes the write cycle wherein write word current and write bit current are utilized as illustrated in FIG. 19 to toggle the selected memory cell. Therefore, control signals B0 and A0 can also be deactivated at the completion of the write cycle. Typically the write operation is allowed to overlap into the next cycle that can be either a read or a write cycle. If the subsequent cycle is a write operation requiring the same current mirrors to be activated, A0 can remain activated into a subsequent write cycle (not shown).

At the end of the write cycle, the common rail attains a voltage that is approximately $V_{DD}$-Vt, where Vt is the threshold voltage of the column decode switch that was previously activated, such as the transistor used to implement column decode switch 390. In the illustrated form, the Vt is a threshold voltage of a metal-oxide semiconductor transistor. If another write operation is performed immediately, the activated column decode switch is able to immediately conduct because the gate-to-source voltage of the activated column decode switch is instantly near a Vt potential. However, if the subsequent write operation occurs a significant amount of time after an earlier first write operation, then the potential of the common rail 397 can drop toward $V_{SS}$ due to charge leakages through transistor 454 and junction leakage from other devices on common rail 397. If a potential drop occurs on common rail 397 when the column decode switch 390 is made conductive by control signal B0-0, the parasitic capacitance associated with the write bit line which is charged fully to $V_{DD}$ discharges through the column decode switch 390 onto the common rail parasitic capacitance 405. This charge sharing between the parasitic capacitances 405 results in a potentially damaging current spike through the selected write bit line. The current spike may result in an unintended write operation of any selected cell on the write bit line. To avoid this problem, a precharge circuit denoted by transistors 402 and 404 enable the common rails 397 and 399 to be held at $V_{DD}$-$V_T$ between write operations where $V_{DD}$-$V_T$ is a voltage generated by References 364 which approximates $V_{DD}$-$V_T$. Control signal P0 illustrated in FIG. 21 is provided by the Bit Write Decode/Compare circuit 362 to control transistors 402 and 404. Control signal P (P0, P1, etc.) is made nonconductive during a write operation. The value of the precharge voltage may not be significantly greater than $V_{DD}$-$V_T$ because when C0 is activated for a write operation, the charge on parasitic capacitance 405 must first discharge through the constant current Is to the point that the voltage on the common rail 397 drops to $V_{DD}$-$V_T$ before the column decode switch 390 activated by signal B0 begins to significantly conduct thereby drawing current from the Write Bit line to perform the write operation. This introduces a delay at the start of the write operation that negatively impacts the speed of the memory. Thus, precharge voltage values departing significantly from the $V_{DD}$-Vt value is detrimental. Higher values reduce the speed and lower values increase the probability of an inadvertent write. The circuitry within the references 364 are designed to track voltage, process and temperature variations of the threshold voltage Vt of the column decode switches and of the power supply $V_{DD}$.

By now it should be apparent that there has been provided an MRAM architecture having circuit features that enable an efficient and fast toggle write operation of an MRAM. Power savings are achieved with the use of series-connected switchable multiple stage current mirrors. By precharging a common rail having multiple write bit lines connected together, the write noise immunity is improved and current spikes are minimized. Additionally, the speed of a write operation is enhanced. The use of RC circuits, including the advantageous use of parasitic resistance and capacitance, results in insensitivity to voltage and temperature variations. Timing of the write operation control signals is selective so that the program currents transition between values in a precise controlled time range. Additionally, the length of time that programming currents are present and the value of the programming current is accurately controlled to ensure reliable programming. Various changes and modifications to the embodiments herein chosen for purposes of illustration will readily occur to those skilled in the art. For example, although a toggle programming MRAM is discussed for some applications, it should be apparent that other types of memory cells may utilize the features disclosed herein. Variations in the types of conductivities of transistors, the types of transistors, etc. may be readily made. Although specific logic circuits have been shown, numerous logic circuit implementations may be used to implement the functions discussed herein. To the extent that such modifications and variations do not depart from the spirit of the invention, they are intended to be included within the scope thereof which is assessed only by a fair interpretation of the following claims.

What is claimed is:

1. A memory comprising:
    a plurality of memory cells organized in rows and columns, each of the plurality of memory cells located at intersections of the rows and columns;
    a plurality of write lines, each of the plurality of write lines having a first end and a second end, wherein a current flowing from the first end to the second end is used for placing a data value in a predetermined memory cell of the plurality of memory cells, the second end coupled to a reference voltage terminal for allowing the current to flow to the reference voltage terminal;
    a plurality of write decode switches, each of the plurality of write decode switches having a first terminal connected to the second end of a corresponding one of the plurality of write lines, and a second terminal, the second terminal of each of the plurality of write decode switches being commonly connected at a first common node;

a write circuit having an output connected to the first common node for controlling writing the plurality of memory cells; and a precharge circuit directly connected to the first common node for precharging the first common node to a first predetermined voltage.

2. A memory comprising:

a plurality of memory cells organized in rows and columns, each of the plurality of memory cells located at intersections of the rows and columns;

a plurality of write lines, each of the plurality of write lines having a first end and a second end, wherein a current flowing from the first end to the second end is used for placing a data value in a predetermined memory cell of the plurality of memory cells;

a plurality of write decode switches, each of the plurality of write decode switches having a first terminal connected to the second end of a corresponding one of the plurality of write lines, and a second terminal, the second terminal of each of the plurality of write decode switches being commonly connected at a first common node;

a write circuit having an output connected to the first common node for controlling writing the plurality of memory cells; and a precharge circuit connected to the first common node for precharging the first common node to a first predetermined voltage, wherein the first end of each of the plurality of write lines are coupled together at a second common node, the second common node for receiving a second predetermined voltage, wherein the second predetermined voltage is different than the first predetermined voltage by a voltage approximating a threshold voltage of a metal-oxide semiconductor transistor.

3. The memory of claim 2, wherein the precharge circuit recharges the second terminal of each of the plurality of write decode switches after a write cycle of the memory.

4. The memory of claim 2, wherein the memory is characterized as being a magnetoresistive random access memory.

5. The memory of claim 4, wherein the data value is placed in the predetermined memory cell by toggling the predetermined memory cell between two logic states.

6. The memory of claim 5, further comprising a write control circuit, coupled to the write circuit, for initiating a read operation prior to a write cycle, the write control circuit for terminating at least a portion of the write cycle if a currently stored data value is identical to a new data value desired to be written to the predetermined memory cell.

7. The memory of claim 2, wherein the plurality of write lines are characterized as being a plurality of write bit lines, a write bit line of the plurality of write bit lines corresponding to a column of the plurality of memory cells.

8. The memory of claim 2, wherein the plurality of write lines are characterized as being a plurality of write word lines, a write word line of the plurality of write word lines corresponding to a row of the plurality of memory cells.

9. The memory of claim 2, wherein first ends of the plurality of write lines are all connected to a common node for receiving a power supply voltage.

10. A memory comprising:

a plurality of memory cells organized in rows and columns, each of the plurality of memory cells located at intersections of the rows and columns;

a plurality of write bit lines, each of the plurality of write bit lines having a first end and a second end, wherein a first current flowing from the first end to the second end of a selected one of the plurality of write bit lines is used for placing a data value in a predetermined memory cell of the plurality of memory cells;

a plurality of write word lines, each of the plurality of write word lines having a first end and a second end, wherein a second current flowing from the first end to the second end of a selected one of the plurality of write word lines is used for placing the data value in the predetermined memory cell of the plurality of memory cells;

a plurality of write bit decode switches, each of the plurality of write bit decode switches having a first terminal connected to the second end of a corresponding one of the plurality of write bit lines, and a second terminal, each second terminal of the plurality of write bit decode switches being commonly connected to a first common node;

a first write circuit having an output connected to the first common node for controlling writing a first portion of the plurality of memory cells; and a plurality of write word decode switches, each of the plurality of write word decode switches having a first terminal connected to the second end of a corresponding one of the plurality of write word lines, and a second terminal, each second terminal of the plurality of write word decode switches being commonly connected to a second common node;

a second write circuit having an output connected to the second common node for controlling writing a second portion of the plurality of memory cells;

a first precharge circuit connected to the first common node for precharging each second terminal of the plurality of write bit decode switches to a first predetermined voltage; and a second precharge circuit connected to the second common node for precharging each second terminal of the plurality of write word decode switches to a second predetermined voltage.

11. The memory of claim 10, wherein the memory is characterized as being a magnetoresistive random access memory and the data value is placed in the predetermined memory cell by toggling the predetermined memory cell between two logic states.

12. The memory of claim 11, further comprising a write control circuit, coupled to the first write circuit, for initiating a read operation prior to a write cycle, the write control circuit terminating at least a portion of the write cycle if a currently stored data value is identical to a new data value desired to be written to the predetermined memory cell.

13. The memory of claim 10, wherein the first end of the plurality of write bit lines are connected to a third common node with a third predetermined voltage, the first predetermined voltage being different from the third predetermined voltage by about a threshold voltage of a metal-oxide semiconductor transistor.

14. The memory of claim 10, wherein the first end of the plurality of write word lines are connected to a third common node with a third predetermined voltage, the second predetermined voltage being different from the third predetermined voltage by about a threshold voltage of a metal-oxide semiconductor transistor.

15. The memory of claim 10, wherein the first precharge circuit recharges the first common node after a write cycle of the memory.

16. The memory of claim 10, wherein the second precharge circuit recharges the second common node after a write cycle of the memory.

17. In a memory having a plurality of magnetoresistive random access memory cells organized in rows and columns, a plurality of write lines is coupled together at a common node, a write circuit coupled to the common node for causing a write current to flow through a selected write line of the plurality of write lines, a method for writing a data value in a predetermined memory cell of the plurality of magnetoresistive random access memory cells comprising the steps of:

precharging the common node to a predetermined voltage;

initiating a read operation of the predetermined memory cell to determine a presently stored data value of the predetermined memory cell;

comparing the presently stored data value of the predetermined memory cell to a new data value to be written to the predetermined memory cell and determining that the new data value is different than the presently stored data value; and initiating a write operation of the predetermined memory cell by causing the write current to flow in the selected write line of the plurality of write lines for toggling the presently stored data value to the new data value.

* * * * *